(12) United States Patent
Jo et al.

(10) Patent No.: US 11,309,446 B2
(45) Date of Patent: Apr. 19, 2022

(54) RESISTIVE SWITCHING ELEMENT AND PHOTOVOLTAIC DEVICE INCLUDING THE SAME

(71) Applicant: EWHA UNIVERSITY—INDUSTRY COLLABORATION FOUNDATION, Seoul (KR)

(72) Inventors: William Jo, Seoul (KR); Hye Jin Jin, Seoul (KR)

(73) Assignee: EWHA UNIVERSITY—INDUSTRY COLLABORATION FOUNDATION, Seoul (KR)

( * ) Notice: Subject to any disclaimer, the term of this patent is extended or adjusted under 35 U.S.C. 154(b) by 0 days.

(21) Appl. No.: 16/434,685

(22) Filed: Jun. 7, 2019

(65) Prior Publication Data
US 2019/0378946 A1 Dec. 12, 2019

(30) Foreign Application Priority Data

Jun. 8, 2018 (KR) .......... 10-2018-0066062
Dec. 18, 2018 (KR) .......... 10-2018-0164591

(51) Int. Cl.
*H01L 31/06* (2012.01)
*H01L 29/24* (2006.01)
*H01L 31/032* (2006.01)
*H01L 31/09* (2006.01)

(52) U.S. Cl.
CPC .............. *H01L 31/06* (2013.01); *H01L 29/24* (2013.01); *H01L 31/032* (2013.01); *H01L 31/09* (2013.01)

(58) Field of Classification Search
CPC ....... H01L 31/06; H01L 31/032; H01L 31/09; H01L 31/072; H01L 29/24; H01L 45/04
See application file for complete search history.

(56) References Cited

U.S. PATENT DOCUMENTS

| 2015/0179933 A1 | 6/2015 | Mathur et al. |
| 2015/0333196 A1* | 11/2015 | Shin ................ H01L 31/022408 257/29 |
| 2017/0098791 A1* | 4/2017 | Bao ........................ H01L 51/052 |

FOREIGN PATENT DOCUMENTS

| CN | 205723636 U | * 11/2016 |
| KR | 20060010785 A | 2/2006 |
| KR | 100890609 B1 | 3/2009 |
| KR | 20110072921 A | 6/2011 |

OTHER PUBLICATIONS

Fei, Visible Light Responsive Perovskite BiFeO3 Pills and Rods with Dominant {111 }c Facets, Cryst. Growth Des. 2011, 11, 1049-1053 (Year: 2011).*

(Continued)

*Primary Examiner* — Devina Pillay
(74) *Attorney, Agent, or Firm* — Fox Rothschild LLP

(57) ABSTRACT

The present disclosure relates to a resistive switching element in which polarization of a ferroelectric material layer and electron-hole separation phenomenon of a two dimensional semiconducting material layer are combined to induce resistive switching phenomenon, and a photovoltaic device such as a solar cell, including the resistive switching element.

6 Claims, 24 Drawing Sheets

```
┌─────────────────────────────────┐
│  2D SEMICONDUCTING MATERIAL     │
├─────────────────────────────────┤
│        FERROELECTRIC            │
├─────────────────────────────────┤
│       BOTTOM ELECTRODE          │
├─────────────────────────────────┤
│          SUBSTRATE              │
└─────────────────────────────────┘
```

\<BASIC STRUCTURE\>

(56) References Cited

OTHER PUBLICATIONS

Pan, Polarization-dependent interfacial coupling modulation of ferroelectric photovoltaic effect in PZT-ZnO heterostructures, Sci. Rep. 6, 22948; doi: 10.1038/srep22948 (2016), pp. 1-9 (Year: 2016).*
CN-205723636-U, Machine Translation (Year: 2016).*
Silva et al., "Resistive switching in MoSe2/BaTiO3 hybrid structures," J. Mater. Chem. (2017); 5:10353-10359.
Jin et al., Control of conducting state for memristive switching by 2-dimensional atomic sheets, The 5th Korean Symposium on Graphene and 2D Mateirlas (Mar. 29, 2018); 1 page.
Jin et al., "Multidimensional memrisitve system: ferroelectric oxide with 2-dimensional sheets," The Korea Physical Society Spring Meeting (Apr. 25, 2018); 1 page.
Scott, James F., "Ferroelectric Memories," Science (Dec. 15, 1989); 246(4936):1400-1405.

* cited by examiner

<BASIC STRUCTURE>

<2D-3D OXIDE>

<WITH TRANSPARENT ELECTRODE>

<FLEXIBLE SUBSTRATE>

RESISTIVE SWITCHING ELEMENT AND PHOTOVOLTAIC DEVICE INCLUDING THE SAME

CROSS-REFERENCE TO RELATED APPLICATION

This application claims the benefit under 35 USC 119(a) of Korean Patent Application 10-2018-0066062 filed on Jun. 8, 2018, and Korean Patent Application No. 10-2018-0164591 filed on Dec. 18, 2018 in the Korean Intellectual Property Office, the entire disclosures of which are incorporated herein by reference for all purposes.

TECHNICAL FIELD

The present disclosure relates to a resistive switching element in which polarization of a ferroelectric layer and electron-hole separation phenomenon of a two dimensional semiconducting material layer are combined to induce resistive switching phenomenon, and a photovoltaic device such as a solar cell, including the resistive switching element.

BACKGROUND

Ferroelectric materials have been applied to many electronic devices such as memories, actuators, and sensors due to spontaneous polarization and switching behaviors of the ferroelectric materials. Further, integration of the ferroelectric materials with semiconducting materials such as ZnO and GaN has been studied.

A ferroelectric-semiconducting heterojunction is applied to a photovoltaic system. In such photovoltaic devices, ferroelectric polarization is an external field in a heterojunction that aids physical separation of photo-generated carriers in semiconductor that cause stable separation of electron-hole pairs. The ferroelectric polarization can be also used in a photoelectrochemical process and piezocatalysis. The charge distribution can be also optically controlled by introducing optical switching feature of the ferroelectric materials caused by ultraviolet radiation. The controlling of resistive switching effect can be optically obtained by optically controlling a conduction state, and a photosensitive memristor or an optoelectronic resistive switching memory can be obtained.

SUMMARY

The present disclosure relates to a resistive switching element in which polarization of a ferroelectric material layer and electron-hole separation phenomenon of a two dimensional semiconducting material layer are combined to induce resistive switching phenomenon, and a photovoltaic device such as a solar cell, including the resistive switching element.

However, problems to be solved by the present disclosure are not limited to the above-described problems. Although not described herein, other problems to be solved by the present disclosure can be clearly understood by a person with ordinary skill in the art from the following description.

According to a first aspect of the present disclosure, there is provided a resistive switching element, including: a bottom electrode formed on a substrate; an oriented ferroelectric material layer formed on the bottom electrode; a two dimensional semiconducting material layer formed on the ferroelectric material layer; and a top electrode formed on the two dimensional semiconducting material layer, wherein polarization of the ferroelectric material layer and electron-hole separation phenomenon of the two dimensional semiconducting material layer are combined to induce resistive switching phenomenon.

According to a second aspect of the present disclosure, there is provided a photovoltaic device, including the resistive switching element according to the first aspect.

According to embodiments of the present disclosure, it is possible to obtain the polarization-dependent interfacial coupling effect by inserting 2D semiconducting layers into a ferroelectrics-based heterostructure. Further, the charge distribution in the 2D semiconducting layers can be controlled by ferroelectric polarization, resulting in the induced dipole effect. By substituting conventional semiconducting materials with 2D semiconducting materials, miniaturization of electronic devices can be achieved. Therefore, the ferroelectric polarization in a heterojunction can be an effective method for controlling electrical characteristics.

According to embodiments of the present disclosure, a ferroelectric-2D semiconducting heterojunction can be applied to a photovoltaic system. In such photovoltaic devices, ferroelectric polarization is an external field in a heterojunction that aids physical separation of photo-generated carriers in 2D semiconductors that cause stable separation of electron-hole pairs. The ferroelectric polarization can be also used in a photoelectrochemical process and piezocatalysis. The charge distribution can be optically controlled by introducing optical switching characteristics of the ferroelectric materials caused by ultraviolet radiation. The resistive switching characteristics effect can be optically obtained by optically controlling a conduction state, and a photosensitive memristor or an optoelectronic resistive switching memory can be obtained.

According to embodiments of the present disclosure, the present inventors studied the improvement in the resistive switching effect by integrating a ferroelectric $PbTiO_3$ thin film with 2D semiconducting atomic sheets of n-type $MoS_2$ and p-type ambipolar $WSe_2$. The present inventors also studied for obtaining the polarization-dependent interfacial coupling effect by using 2D semiconductors and obtained and improved the photovoltaic properties by controlling a ferroelectric polarization state.

According to embodiments of the present disclosure, the ferroelectric material can induce effective charge separation of charge carriers in the 2D semiconducting material by using spontaneous polarization.

According to embodiments of the present disclosure, the ferroelectric material can improve the photovoltaic effect by coupling the ferroelectric material with 2D semiconducting properties.

According to embodiments of the present disclosure, a photovoltaic device can reduce the burden caused by the application of an external voltage by using the ferroelectric material and improve the efficiency stability by using polarization retention properties.

According to embodiments of the present disclosure, the resistive switching element including a heterojunction of a ferroelectric material layer and a 2D semiconducting layer can be used for manufacturing novel photovoltaic devices by using interactions between free charges in the 2D semiconducting sheets and bound charges in the ferroelectric polarization.

According to embodiments of the present disclosure, electron-hole separation phenomenon caused by absorbing light can be induced in a 2D semiconductor and polarization switching characteristic of an oriented ferroelectric material can be used for a photovoltaic device.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1A is a schematic diagram illustrating a basic structure of a photovoltaic device, FIG. 1B is a schematic diagram illustrating a photovoltaic device including a 2D-3D oxide, FIG. 1C is a schematic diagram illustrating a photovoltaic device with a transparent electrode, and FIG. 1D is a schematic diagram illustrating a photovoltaic device including a flexible substrate, in accordance with embodiments of the present disclosure.

DETAILED DESCRIPTION

Figure 1A:
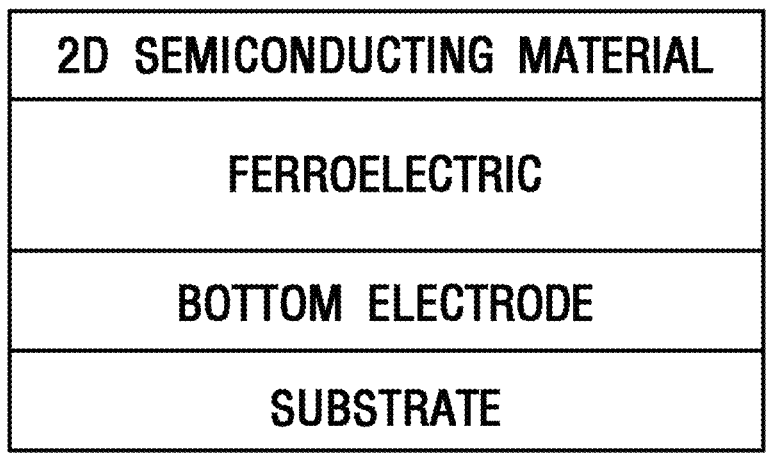
FIGS. 1A, 1B, 1C and 1D are schematic diagrams illustrating a photovoltaic device including a heterojunction of a ferroelectric material and a 2D semiconducting material in accordance with embodiments of the present disclosure.
Figure 1B:
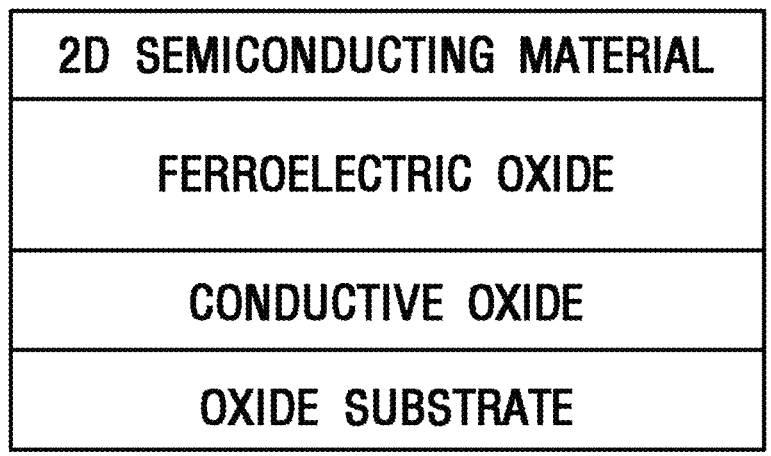
Figure 1C:
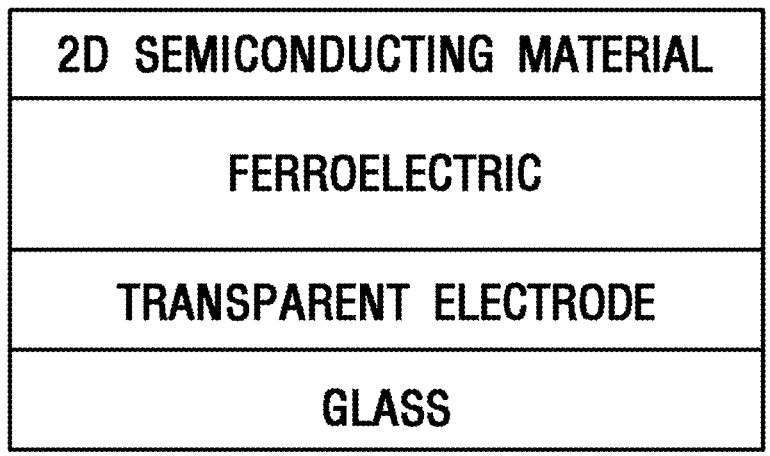
Figure 1D:
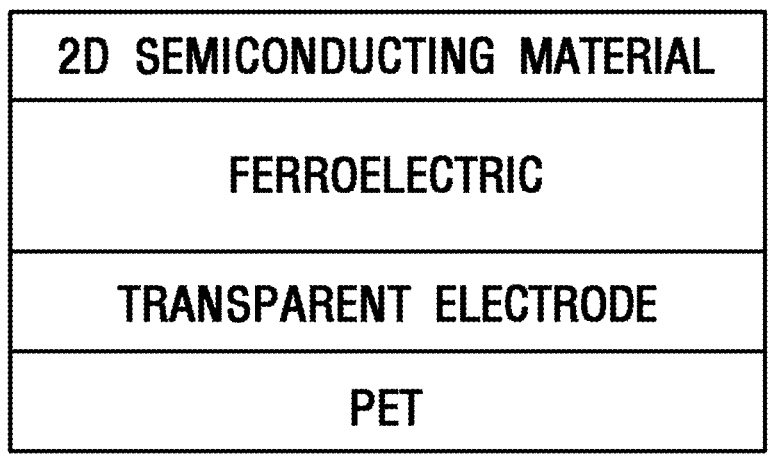
Figure 2A:
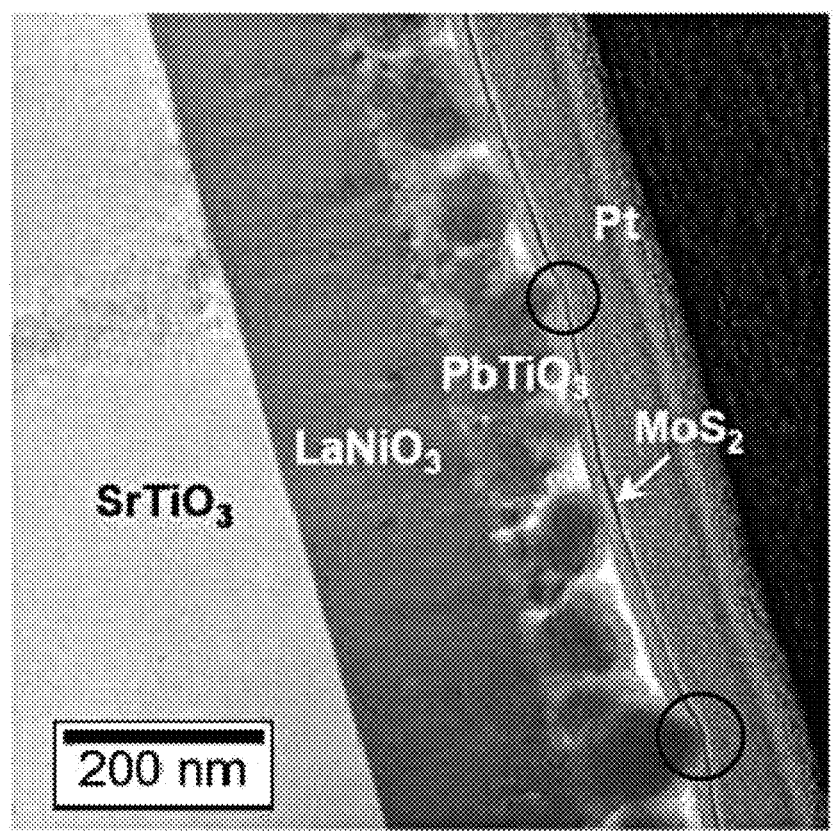
FIG. 2A shows a cross-sectional TEM image of heterostructure formed of $MoS_2$/PTO/LNO/STO by 200 nm scale bar.
Figure 2B:
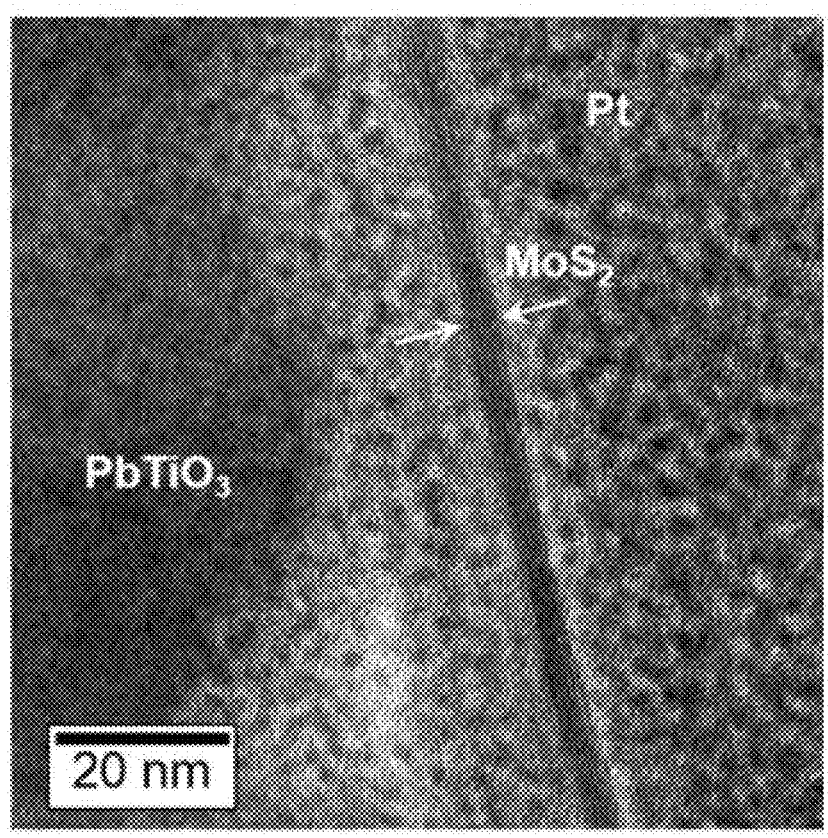
FIG. 2B shows the TEM image of the $MoS_2$/PTO/LNO/STO heterostructure by 20 nm scale bar.
Figure 2C:
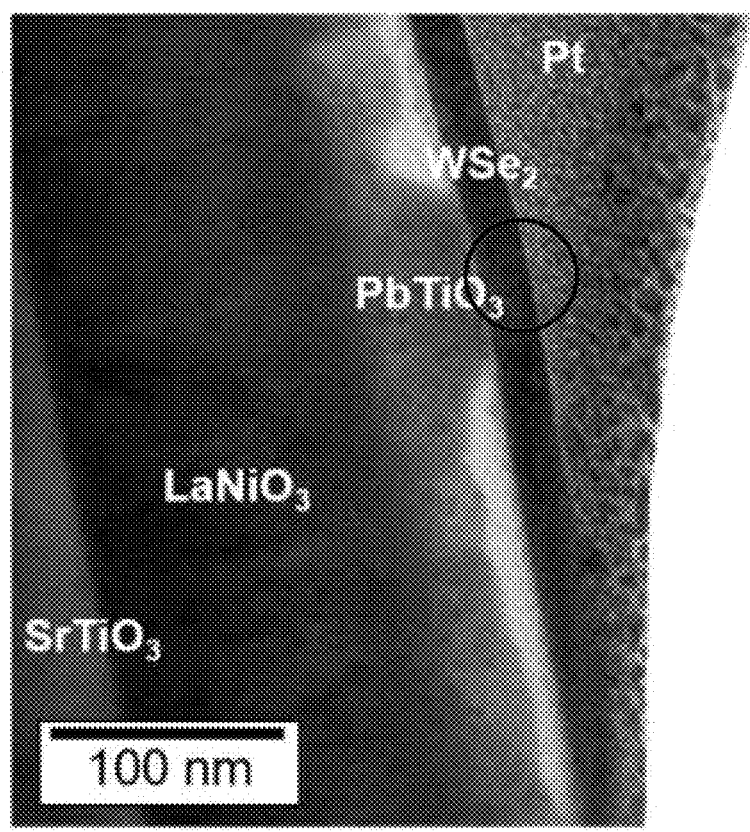
FIG. 2C shows a cross-sectional TEM image of heterostructure formed of $WSe_2$/PTO/LNO/STO by 100 nm scale bar.
Figure 2D:
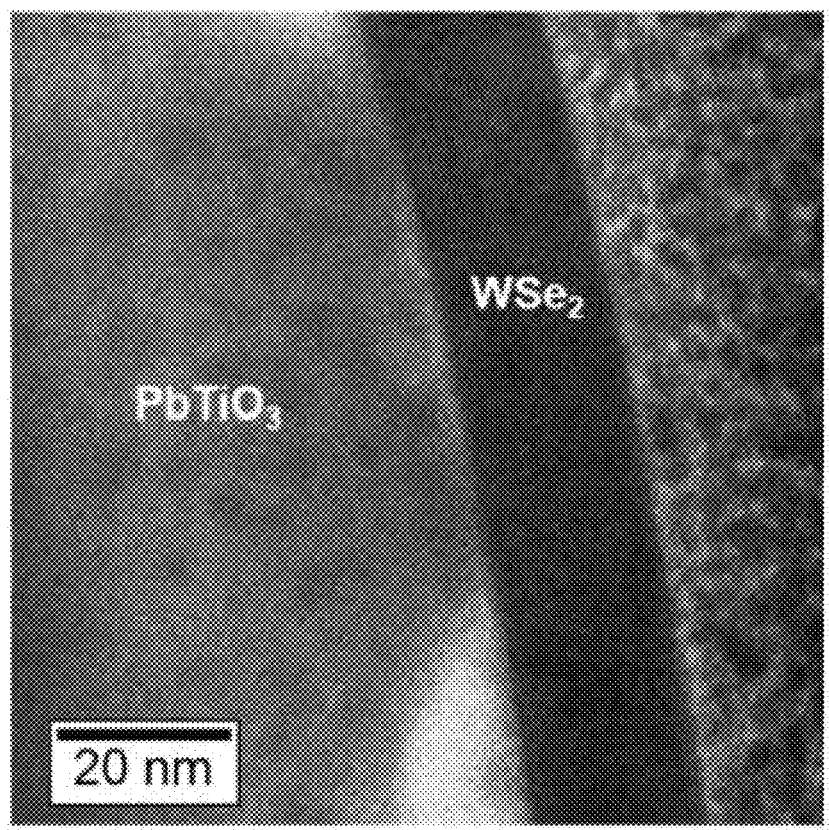
FIG. 2D shows the TEM image of the $WSe_2$/PTO/LNO/STO heterostructure by 20 nm scale bar, respectively, in accordance with an example of the present disclosure.

Hereafter, examples will be described in detail with reference to the accompanying drawings so that the present disclosure may be readily implemented by those skilled in the art. However, it is to be noted that the present disclosure is not limited to the examples but can be embodied in various other ways. In the drawings, parts irrelevant to the description are omitted for the simplicity of explanation, and like reference numerals denote like parts through the whole document.

Throughout this document, the term "connected to" may be used to designate a connection or coupling of one element to another element and includes both an element being "directly connected to" another element and an element being "electronically connected to" another element via another element.

Through the whole document, the term "on" that is used to designate a position of one element with respect to another element includes both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereinafter, embodiments and examples of the present disclosure will be described in detail with reference to the accompanying drawings. However, the present disclosure may not be limited to the following embodiments, examples, and drawings.

A first aspect of the present disclosure provides a resistive switching element, including: a bottom electrode formed on a substrate; an oriented ferroelectric material layer formed on the bottom electrode; a two dimensional semiconducting material layer formed on the ferroelectric material layer; and a top electrode formed on the two dimensional semiconducting material layer, and polarization of the ferroelectric material layer and electron-hole separation phenomenon of the two dimensional semiconducting material layer are combined to induce resistive switching phenomenon.

In an embodiment of the present disclosure, a heterojunction is formed between the ferroelectric material layer and the two dimensional semiconducting material layer. The ferroelectric-2D semiconducting heterojunction can be applied to a photovoltaic system. In such photovoltaic devices, ferroelectric polarization is an external field in a heterojunction that aids physical separation of photo-generated carriers in the 2D semiconductors that cause stable separation of electron-hole pairs.

In an embodiment of the present disclosure, the ferroelectric material may include $PbTiO_3$, $BaTiO_3$, $BiFeO_3$, $PbZr_xTi_{1-x}O_3$ (PZT), or $LiNbO_3$, but may not be limited thereto.

In an embodiment of the present disclosure, the ferroelectric material layer may have a crystal form of a hexagonal structure grown in (111) or (001) direction, but may not be limited thereto.

In an embodiment of the present disclosure, the ferroelectric material layer may be poled upward or downward, but may not be limited thereto. If a ferroelectric polarization state is aligned in a certain direction by poling, the transport properties are changed.

In an embodiment of the present disclosure, the two dimensional semiconducting material may include $MoS_2$, $MoSe_2$, $WSe_2$, $ReS_2$, $ReSe_2$, $MoTe_2$, $WS_2$, or $WTe_2$, but may not be limited thereto. By using materials with semiconducting properties, the electrical characteristics can be obtained by using interactions between bound charges in the ferroelectric polarization and free charges in the semiconductor. A representative n-type semiconductor used in the two dimensional semiconducting material may be $MoS_2$, and a representative p-type semiconductor may be $WSe_2$.

In an embodiment of the present disclosure, the ferroelectric material layer may have a thickness of from about 50 nm to about 100 nm, the two dimensional semiconducting material layer may have a thickness of from about 3 nm to about 15 nm, or the two dimensional semiconducting material layer may have a number of layers of from about 4 layers to about 20 layers, but may not be limited thereto. For example, the ferroelectric material layer may have a thickness of from about 50 nm to about 100 nm, from about 50 nm to about 80 nm, from about 50 nm to about 60 nm, from about 70 nm to about 100 nm, or from about 70 nm to about 80 nm, but may not be limited thereto. For example, the two dimensional semiconducting material layer may have a thickness of from about 3 nm to about 15 nm, from about 3 nm to about 10 nm, from about 3 nm to about 5 nm, from about 6 nm to about 15 nm, from about 6 nm to about 10 nm, from about 9 nm to about 15 nm, or from about 9 nm to about 10 nm, but may not be limited thereto. The two dimensional semiconducting material layer may have a number of layers of from about 4 layers to about 20 layers, from about 4 layers to about 15 layers, from about 4 layers to about 10 layers, from about 4 layers to about 8 layers, from about 8 layers to about 20 layers, from about 8 layers to about 15 layers, from about 10 layers to about 20 layers, from about 12 layers to about 20 layers, or from about 12 layers to about 15 layers, but may not be limited thereto.

In an embodiment of the present disclosure, the top electrode may include a metal such as Pt, Au, Ag, Pd, Al, Co, or the like or a two dimensional metal such as graphene, but may not be limited thereto.

In an embodiment of the present disclosure, the bottom electrode may include a metal or a conductive oxide, and may be a transparent or opaque electrode, but may not be limited thereto. For example, the metal may include Fe, Mn, Ni, V, Co, Ti, Mg, Ca, Cu, Nb, or Zr, but may not be limited thereto. For example, the conductive oxide may include $SrRuO_3$, $(La,Sr)CoO_3$, ITO, FTO, ruthenium oxides (e.g., $RuO_2$ or the like), nickel oxides (e.g., NiO or the like), iridium oxides (e.g., $IrO_2$ or the like), tin oxides (e.g., $SnO_2$ or the like), indium oxides (e.g., $In_2O_3$ or the like), or vanadium oxides (e.g., $V_2O_5$ or the like), but may not be limited thereto.

In an embodiment of the present disclosure, the substrate may be flexible, transparent, or flexible and transparent, but may not be limited thereto. For example, the substrate may include a metal, a metal oxide, a polymer (PET or the like), or glass, but may not be limited thereto. For example, as the substrate, a monocrystalline substrate of $SrTiO_3$, GaN, or the like can be used, but may not be limited thereto.

According to embodiments of the present disclosure, ferroelectric-semiconducting heterojunction is applied to a photovoltaic system. In such photovoltaic devices, the ferroelectric polarization is an external field in a heterojunction that aids physical separation of photo-generated carriers in semiconductors that cause stable separation of electron-hole pairs. The ferroelectric polarization can be also used in a photoelectrochemical process and piezocatalysis. The charge distribution can be optically controlled by introducing optical switching properties of the ferroelectric materials caused by ultraviolet radiation. The control of resistive switching effect can be optically obtained by optically controlling a conduction state, and a photosensitive memristor or an optoelectronic resistive switching memory can be obtained.

The improvement in the resistive switching effect can be achieved by integrating a ferroelectric $PbTiO_3$ thin film with semiconducting atomic sheets of n-type $MoS_2$ and p-type WSe$_2$. In accordance with some embodiments of the present disclosure, the polarization-dependent interfacial coupling effect can be obtained by using the 2D semiconductors. Particularly, the photovoltaic properties can be obtained and improved by controlling a ferroelectric polarization state.

A second aspect of the present disclosure provides a photovoltaic device, including the resistive switching element according to the first aspect.

In an embodiment of the present disclosure, the resistive switching element included the photovoltaic device may include: a transparent electrode formed on a transparent substrate; an oriented ferroelectric material layer formed on the transparent electrode; a two dimensional semiconducting material layer formed on the ferroelectric material layer; and a top electrode formed on the two dimensional semiconducting material layer, but may not be limited thereto.

In an embodiment of the present disclosure, electron-hole separation formed in the two dimensional semiconducting material layer may increase by polarization of the ferroelectric material layer upon light irradiation, but may not be limited thereto.

In an embodiment of the present disclosure, the absorption of light can be increased by using the transparent electrode. For example, as the transparent electrode, a multilayered thin film of AZO (Al-doped ZnO), TiO$_2$ (titanium dioxide), GZO (Ga-doped ZnO), ITO, indium oxide (e.g., In$_2$O$_3$ or the like), or a oxide-metal-oxide structure can be used, but may not be limited thereto. A glass substrate may be used as a substrate for the transparent electrode.

In an embodiment of the present disclosure, the top electrode may include a metal such as Pt, Au, Ag, Pd, Al, Co, or the like, or a two dimensional metal such as graphene, but may not be limited thereto.

In an embodiment of the present disclosure, the ferroelectric material may include PbTiO$_3$, BaTiO$_3$, BiFeO$_3$, PbZr$_x$Ti$_{1-x}$O$_3$ (PZT), or LiNbO$_3$, but may not be limited thereto.

In an embodiment of the present disclosure, the two dimensional semiconducting material may include MoS$_2$, MoSe$_2$, WSe$_2$, ReS$_2$, ReSe$_2$, MoTe$_2$, WS$_2$, or WTe$_2$, but may not be limited thereto. By using materials with semiconducting properties, the electrical characteristics can be obtained by using interactions between bound charges in the ferroelectric polarization and free charges in the semiconductor. A representative n-type semiconductor used in the two dimensional semiconducting material may be MoS$_2$, and a representative p-type semiconductor may be WSe$_2$.

In the photovoltaic device according to an embodiment of the present disclosure, electron-hole separation phenomenon caused by the absorption of light can be induced in the 2D semiconductor and polarization switching characteristic of the oriented ferroelectric material can be used for the photovoltaic device, and the electron-hole separation efficiency can be remarkably increased to improve the photovoltaic efficiency.

The photovoltaic device according to an embodiment of the present disclosure can be applied as a solar cell in that the open voltage and the short circuit current are changed depending on the presence or absence of light.

Hereafter, the present disclosure will be explained in more detail with reference to Examples. However, the following Examples are illustrative only for better understanding of the present disclosure but do not limit the present disclosure.

EXAMPLES

Preparation of Samples

In the present example, ferroelectric PbTiO$_3$(PTO) thin films were fabricated using pulse laser deposition. Monocrystalline (111)-oriented SrTiO$_3$(STO) was used as a substrate, LaNiO$_3$(LNO) was deposited as a bottom electrode, and a PTO thin film was grown on the LNO/STO thin film. To induce a crystal form of a hexagonal structure, (111)-oriented thin film is grown. To this end, a (111)-oriented SrTiO$_3$ monocrystalline substrate can be used. A substrate temperature of 530° C. and an oxygen partial pressure of 300 mTorr may be used as conditions for the growth of a (111)-oriented thin film. To deposit in a (001) direction when LaNiO$_3$ is used as the bottom electrode, a (001)-oriented SrTiO$_3$ monocrystalline substrate can be used. A substrate temperature of 600° C. and an oxygen partial pressure of 350 mTorr may be used as conditions for the deposition of a (001)-oriented LaNiO$_3$ thin film.

A conductive oxide such as SrRuO$_3$ can be used as the bottom electrode instead of LaNiO$_3$. The bottom electrode can be substituted with a transparent electrode, and when the transparent electrode is used, the absorption of light can be increased. When the transparent electrode is used for the sake of orientation, aluminum-doped ZnO (Al:ZnO) can be used as the transparent electrode. A glass substrate may be used as a substrate for the transparent electrode. When the transparent electrode is used, the glass substrate may be substituted with a PET substrate to be used as a flexible element.

Details on the deposition conditions used for the PTO/LNO/STO heterostructure were previously described [Jin, H. J., Oh, S. H. & Jo, W. Hetero-epitaxial growth and large piezoelectric effects in (001) and (111) oriented PbTiO3-LaNiO3 multilayers. J. Phys. D: Appl. Phys. 49, 125305 (2016)]. The (111)-oriented SrTiO$_3$ monocrystalline substrate and the pulse laser deposition were used to fabricate the PTO/LNO/STO heterostructure. The conductive LaNiO$_3$ thin film was deposited at a substrate temperature of 530° C. and an oxygen partial pressure of 350 mTorr. After the deposition of (111)-oriented LaNiO$_3$, the ferroelectric PbTiO$_3$ thin film was grown at a substrate temperature of 530° C. and an oxygen partial pressure of 200 mTorr.

PbTiO$_3$ as well as a lead-free ferroelectric material such as BaTiO$_3$ or BiFeO$_3$ can be grown in the (111) direction for the use. Further, a crystal form of a hexagonal structure can be induced by depositing LiNbO$_3$ (001) direction. If the LaNiO$_3$ electrode layer is grown in the (001) direction, a PbTiO$_3$ thin film can be grown at a temperature of 530° C. and an oxygen partial pressure of 200 mTorr.

Then, semiconducting atomic sheets were peeled off from a SiO$_2$ (300 nm)/Si substrate and then transferred onto the PTO/LNO/STO thin film heterostructure using a wet transfer method.

FIG. 1 is schematic diagrams illustrating a photovoltaic device including a heterojunction of a ferroelectric material and a 2D semiconducting material in accordance with embodiments of the present disclosure. FIG. 1A is a schematic diagram illustrating a basic structure of a photovoltaic device, FIG. 1B is a schematic diagram illustrating a photovoltaic device including a 2D-3D oxide, FIG. 1C is a schematic diagram illustrating a photovoltaic device with a transparent electrode, and FIG. 1D is a schematic diagram illustrating a photovoltaic device including a flexible substrate. Herein, the scale of the device can be reduced by using the 2D semiconducting material and the burden caused by the application of an external voltage can be reduced by using the ferroelectric material. Further, the efficiency stability can be improved by using polarization-maintaining properties.

TEM Characterization

Samples for cross-sectional transmission electron microscopy (TEM) were prepared using a dual beam focused ion beam (FIB) (FEI Helios 650), and images thereof were obtained using a TEM (FEI Titan Cubed G2) operated at 80 kV.

TEM images of the heterostructures were obtained to confirm the stacking configuration and the configuration of the heterostructures to be shown in FIG. 2. FIG. 2 shows the configuration of the structure fabrication. FIG. 2A shows a cross-sectional TEM image of heterostructure formed of $MoS_2$/PTO/LNO/STO by 200 nm scale bar, FIG. 2B shows the TEM image of the $MoS_2$/PTO/LNO/STO heterostructure by 20 nm scale bar, FIG. 2C shows a cross-sectional TEM image of heterostructure formed of $WSe_2$/PTO/LNO/STO by 100 nm scale bar, and FIG. 2D shows the TEM image of the $WSe_2$/PTO/LNO/STO heterostructure by 20 nm scale bar, respectively. The separately grown PTO grains induce bending properties in the 2D layers indicated by black circles in FIG. 2A and FIG. 2C, respectively. In the PTO thin film, the PTO grains were separately grown and showed a columnar structure. Due the roughness of the PTO thin film, the $MoS_2$ or $WSe_2$ layers are bent as shown in FIG. 2A and FIG. 2C. The $MoS_2$ and $WSe_2$ layers had a number of layers of from about 6 layers and about 30 layers, respectively. The bending properties of the 2D semiconducting layers were more apparent for relatively thinner layer samples. The present inventors also conducted elemental analysis using energy dispersive spectroscopy (data not shown). Based on these results, the fabrication of the semiconducting atomic sheets on the ferroelectric thin film was successfully achieved. It was concluded from the result that an intermediate layer thickness (from 10 nm to 20 nm) is suitable to investigate vertical transport properties without bending.

Raman Scattering Spectra

Room temperature Raman scattering spectra of $MoS_2$ and $WSe_2$ on the PTO/LNO/STO thin film were obtained using McPherson 207 spectrometer equipped with a nitrogen-cooled charge-coupled device (CCD) array detector. The samples were excited with a diode-pumped solid state (DPSS) laser of 532 nm (2.33 eV) focused on a region with a diameter of ~1 μm using a microscope objective lens (×50). To suppress laser heating, the excitation power was less than 5 mW. The exposure time was 30 seconds.

Figure 3A:
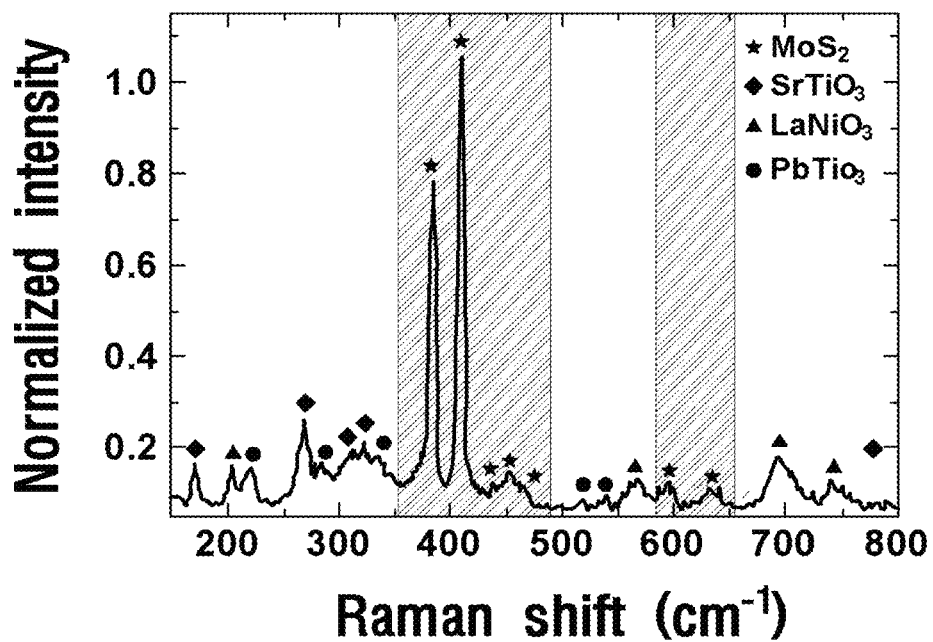
FIG. 3A shows Raman scattering spectrum of the heterostructure formed of $MoS_2$/PTO/LNO/STO.
Figure 3B:
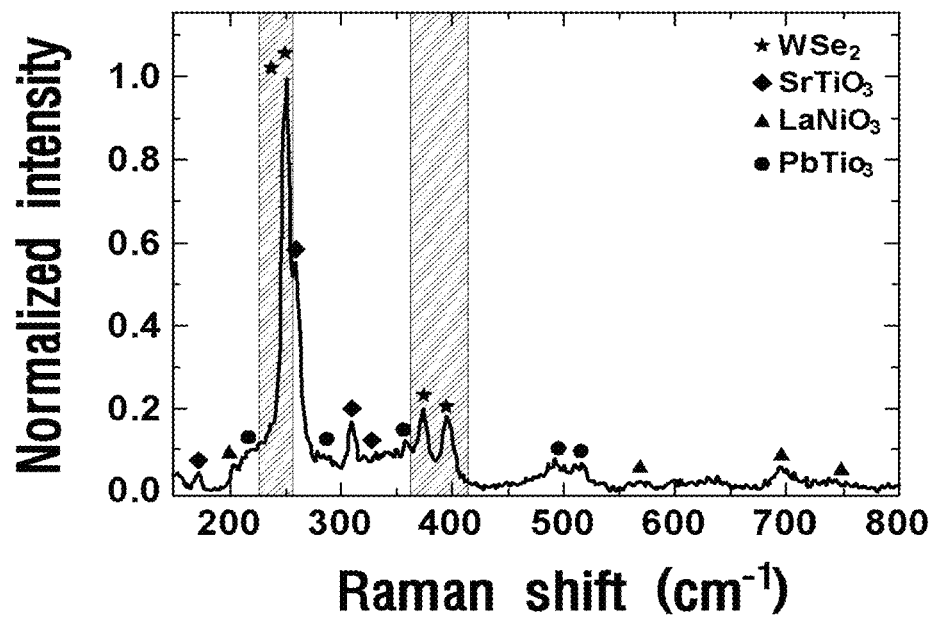
FIG. 3B shows Raman scattering spectrum of the heterostructure formed of $WSe_2$/PTO/LNO/STO in accordance with an example of the present disclosure, in which $MoS_2$ and $WSe_2$ are indicated in the shaded regions, respectively, and PTO, LNO, and STO are indicated in the unshaded regions, respectively.

High crystalline characteristics of the samples were confirmed by using Raman scattering spectroscopy in another way. FIG. 3 shows the phase formation of the heterostructures and Raman spectra of the respective samples. FIG. 3A shows Raman scattering spectrum of the heterostructure formed of $MoS_2$/PTO/LNO/STO and FIG. 3B shows Raman scattering spectrum of the heterostructure formed of $WSe_2$/PTO/LNO/STO in accordance with an example of the present disclosure, in which $MoS_2$ and $WSe_2$ are indicated in the shade regions, respectively and PTO, LNO, and STO are indicated in the unshade regions, respectively. Herein, $MoS_2$, STO, LNO, PTO, and $WSe_2$ represent ★, ♦, ▲, ●, and ★ marks, respectively in FIG. 3A and FIG. 3B. Well-defined $MoS_2$ and $WSe_2$ phonon peaks can be seen from FIG. 3A and FIG. 3B, respectively. Peaks ascribed from the PTO, LNO, and STO substrates were also observed, and each of the spectrum peaks is explained in Table 1 and Table 2.

Table 1 shows the peak positions of PTO, LNO, and STO in the Raman scattering spectra as shown in FIG. 3.

TABLE 1

| | Substrate (PTO/LNO/STO) | | | | | | | | | | | | |
|---|---|---|---|---|---|---|---|---|---|---|---|---|---|
| Peak position (cm$^{-1}$) | 176 | 203 | 219 | 267 | 285 | 309 | 315 | 342 | 451 | 517 | 564 | 693 | 344 |
| Material | STO | LNO | PTO | STO | PTO | STO | STO | PTO | PTO | PTO | STO | STO | STO |

Table 2 shows the peak positions of $MoS_2$ and $WSe_2$ in the Raman scattering spectra and as shown in FIG. 3 and their corresponding vibration modes, respectively.

TABLE 2

| | $MoS_2$ | | | | | | |
|---|---|---|---|---|---|---|---|
| Peak position (cm$^{-1}$) | 383 | 408 | 439 | 452 | 464 | 595 | 633 |
| Mode | $E^1_{2g}$ | $A_{1g}$ | $B_{2g}$ | 2LA(M), $A_{2g}$ | $A_{2u}$ | $E_{1g}$ + LA(M) | $A_{1g}$ + LA(M) |
| | $WSe_2$ | | | | | | |
| Peak position (cm$^{-1}$) | 248 | | 250 | | 260 | 373 | 380 |
| Mode | $E_{2g}$ | | $A_{1g}$ | | 2LA(M) | $E_{2g}$ + LA(M) | 3LA(M) |

Electrical Characterization

To study transport properties of the heterostructures, conductive-atomic force microscopy (C-AFM) was performed. Photocurrents induced by lasers (λ=532 nm and 640 nm) were measured by C-AFM. Ferroelectric polarization-dependent current-voltage (I-V) characteristics were obtained by applying a poling process. If a ferroelectric polarization state is aligned in a certain direction by the poling process, the transport properties are changed. If the polarization is aligned toward $MoS_2$, positive polarization charges strongly prove the accumulation of electrons in $MoS_2$. Therefore, at a positive voltage, current characteristics tend to greatly increase and diode characteristics are strongly exhibited. During the poling process, DC bias +10 V (−10 V) was applied to the samples to induce upward (downward) polarization indicating positive (negative) poling. Photovoltages of the heterostructures were also analyzed by Kelvin probe force microscopy (KPFM), and in this case, Pt/Ir-coating tip was used at a frequency of 60 kHz and an AC-bias voltage (peak-to-peak) of 1 V. To obtain the photovoltages, the KPFM measurement was obtained by irradiation of a laser having the same wavelength as used in the C-AFM measurement under dark condition.

FIG. 4 shows resistive switching behaviors in the heterostructures. FIG. 4A shows a current-voltage characteristics of the heterostructure without a 2D layer, FIG. 4B shows a current-voltage characteristics of the heterostructure with a 2D layer of $MoS_2$, and FIG. 4C shows a current-voltage characteristics of $WSe_2$. In FIG. 4B, $MoS_2$ is a n-type semiconductor in which electrons are main carriers, and, thus significant current appears in the range of positive voltages. In this case, a hysteresis loop shape appears loop due to the ferroelectric polarization switching effect. FIG. 4D shows a schematic diagram illustrating interaction between a 2D layer of n-type semiconductor and a PTO thin film showing upward polarization, and FIG. 4E shows a schematic diagram illustrating interaction between a 2D layer of n-type semiconductor and a PTO thin film showing downward polarization respectively. If the 2D layer is a n-type semiconductor, electrons (black circles) are accumulated (depleted) by upward (downward) polarization state of the ferroelectric thin film.

Figure 4A:
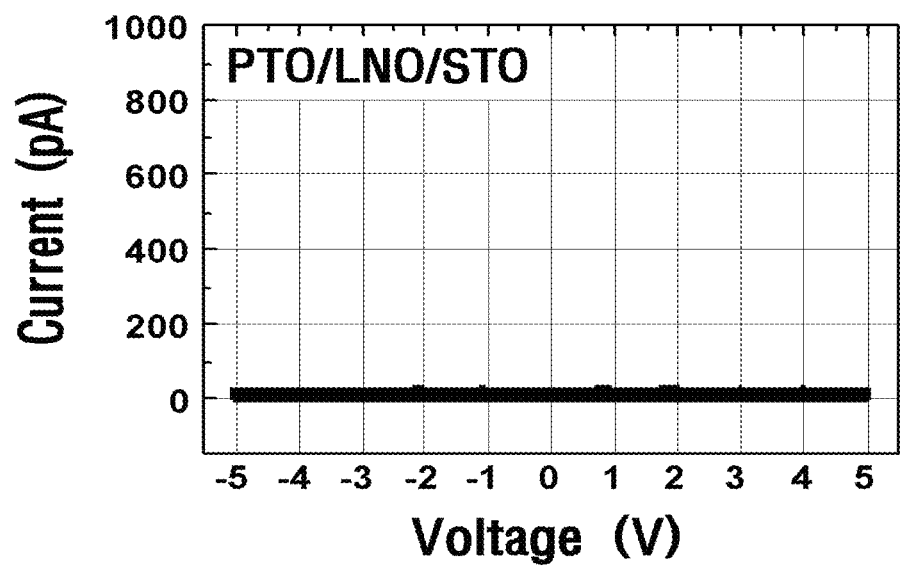
FIG. 4A shows a current-voltage characteristics of the heterostructure without a 2D layer.
Figure 4B:
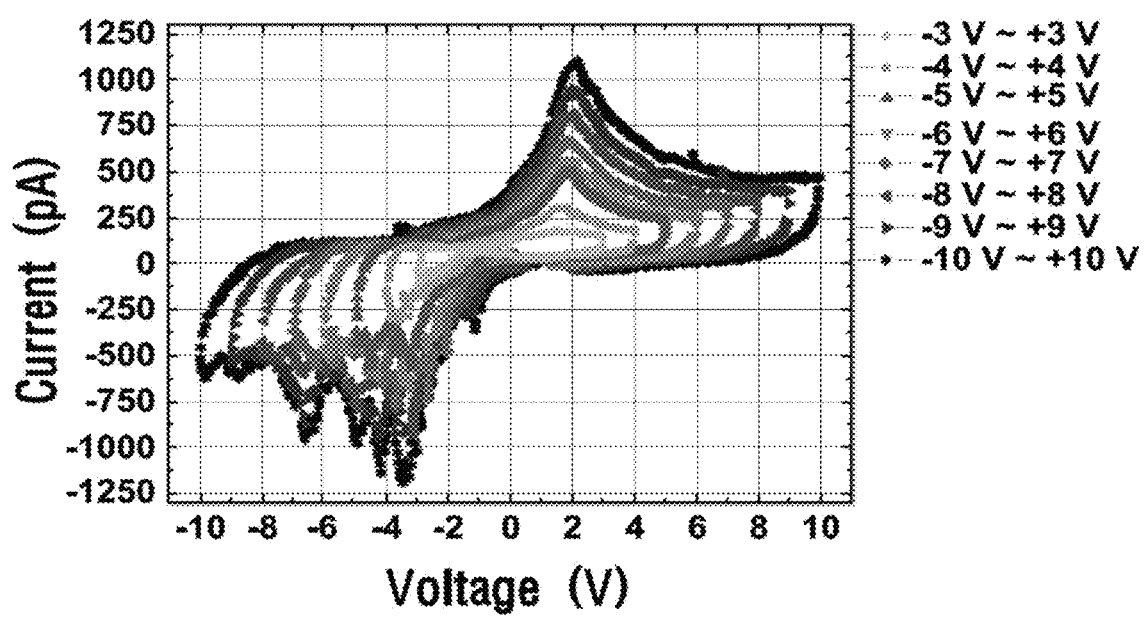
FIG. 4B shows a current-voltage characteristics of the heterostructure with a 2D layer of $MoS_2$.
Figure 4C:
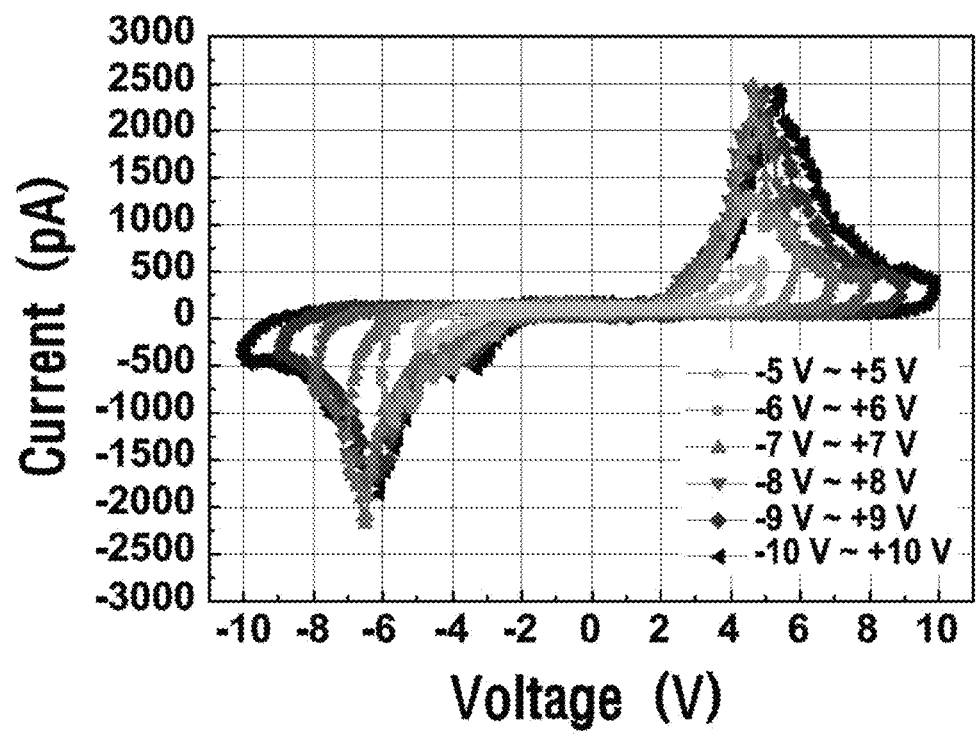
FIG. 4C shows a current-voltage characteristics of $WSe_2$.
Figure 4D:
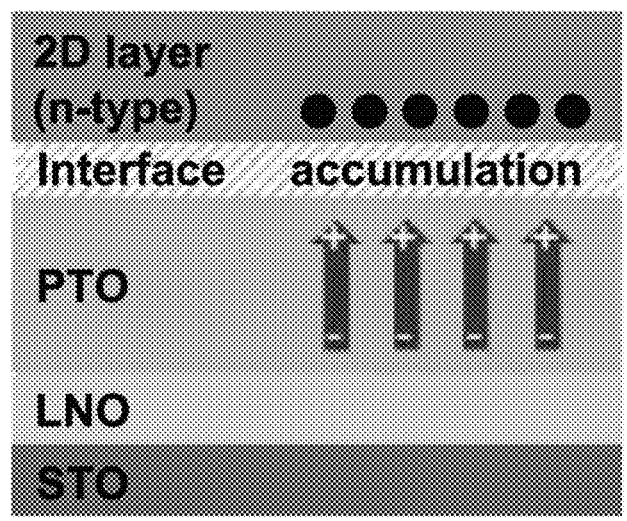
FIG. 4D shows a schematic diagram illustrating interaction between a 2D layer of n-type semiconductor and a PTO thin film showing upward polarization.
Figure 4E:
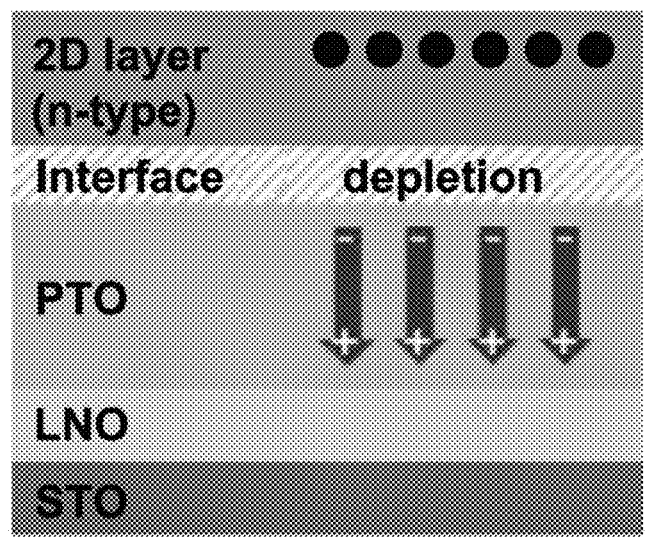
FIG. 4E shows a schematic diagram illustrating interaction between a 2D layer of n-type semiconductor and a PTO thin film showing downward polarization, respectively, in accordance with an example of the present disclosure.

The improved resistive switching (RS) behavior was obtained by using these semiconducting atomic sheets (FIG. 4A to FIG. 4C); and the RS behavior was not obtained from the PTO thin film (FIG. 4A). Changes in electrical characteristics depended on the presence of the $MoS_2$ or $WSe_2$ layers, which indicates interactions between bound charges in the ferroelectric polarization and free charges in the semiconductor atomic sheets. This means the possibility of polarization-dependent interfacial coupling effect. FIG. 4D and FIG. 4E show schematic diagrams illustrating interactions between free charges in the n-type $MoS_2$ layers. In this case, the accumulation of electrons in the $MoS_2$ layers occurs when positive bound charges are located at the interface between the $MoS_2$ layer and the PTO thin film, as shown in FIG. 4D, and the reverse situation occurs when negative bound charges are located at the interface, as shown in FIG. 4E. In the $WSe_2$/PTO heterostructure, the $WSe_2$ layer exhibited p-type characteristics with ambipolar behavior and almost symmetric transport characteristics are generated in the RS effect with respect to the $MoS_2$/PTO heterostructure, as shown in FIG. 4C. Relatively asymmetric feature was obtained in transport characteristics in the $MoS_2$/PTO heterostructure when comparing current values under positive bias with negative bias regions. Rectifying characteristics are more pronounced in the positive bias region because of the polarization-dependent interfacial coupling effect. Electrons are accumulated or depleted by upward polarization or downward polarization, respectively. Effect of the ferroelectric polarization can be also confirmed by changing the sweep voltage range as shown in FIG. 4B and FIG. 4C. Ferroelectric polarizations are aligned and saturation of polarization occurs when increasing the sweep voltage ranges resulting in the increase of current and formation of definite shape of curve. Polarizations are switched when voltage exceeds the values of coercive voltage and it induced the change of conducting states resulting in hysteresis in the transport characteristics.

Figure 5A:
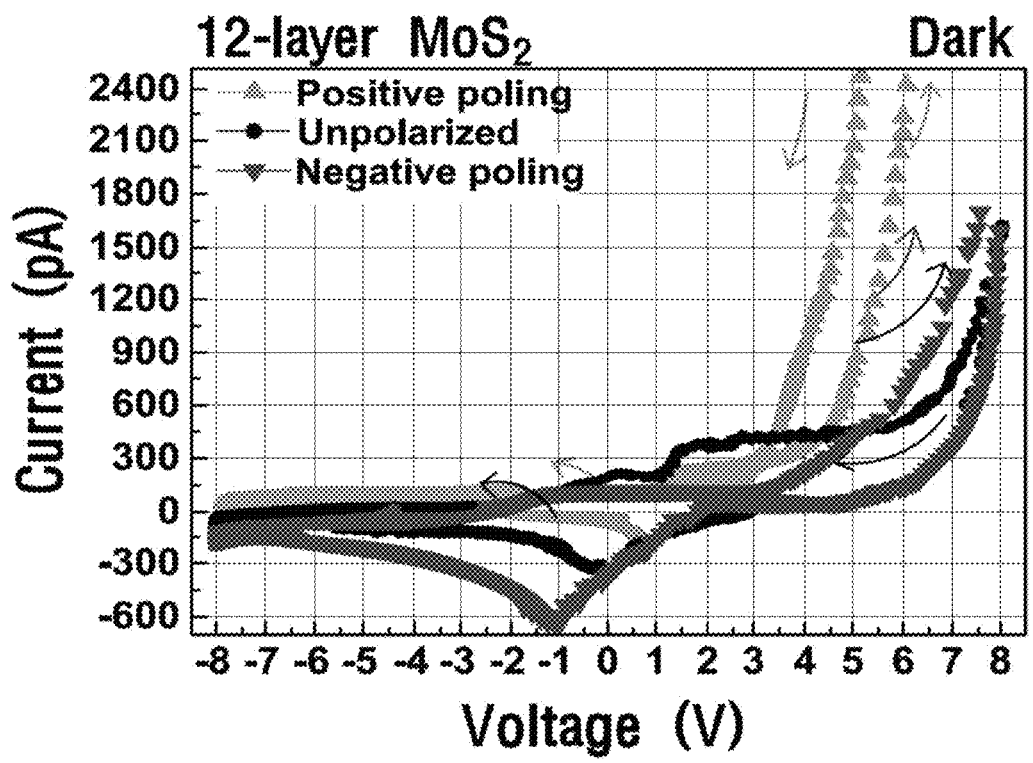
FIG. 5A shows switching properties of a $MoS_2$ layer depending on poling process after positive poling (▲), with no poling (●), and after negative poling (▼).
Figure 5B:
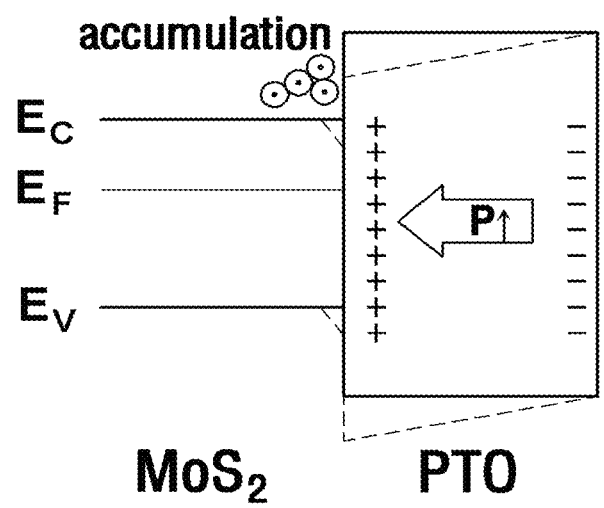
FIG. 5B shows the band alignment in the $MoS_2$ layer according to ferroelectric polarization direction.
Figure 5C:
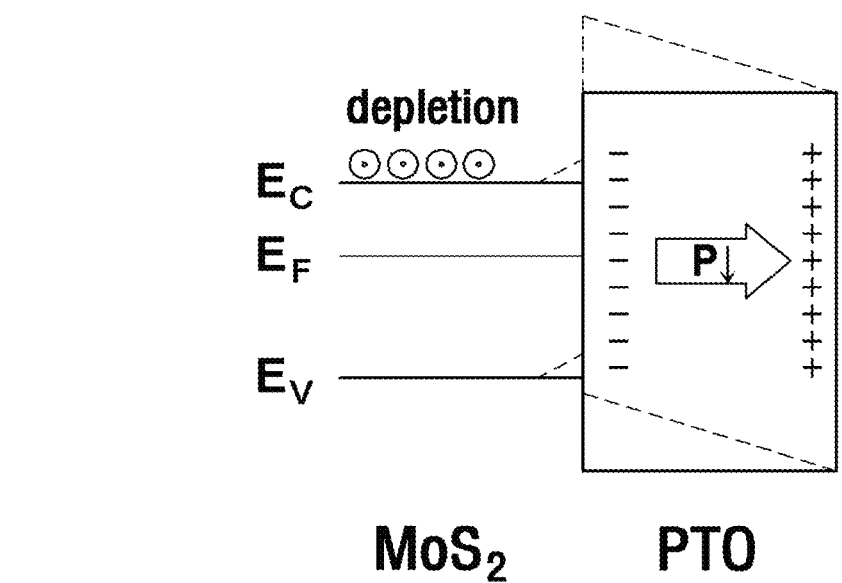
FIG. 5C shows the band alignment in the $MoS_2$ layer according to ferroelectric polarization direction.
Figure 5D:
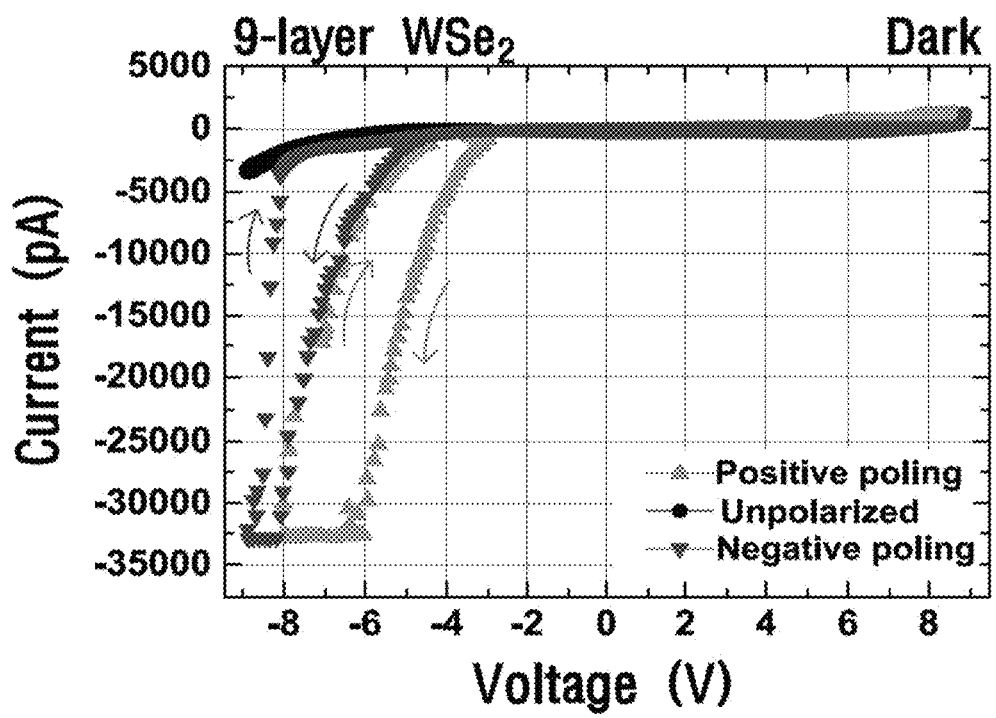
FIG. 5D shows switching properties of a $WSe_2$ layer depending on poling process after positive poling (▲), with no poling (●), and after negative poling (▼).
Figure 5E:
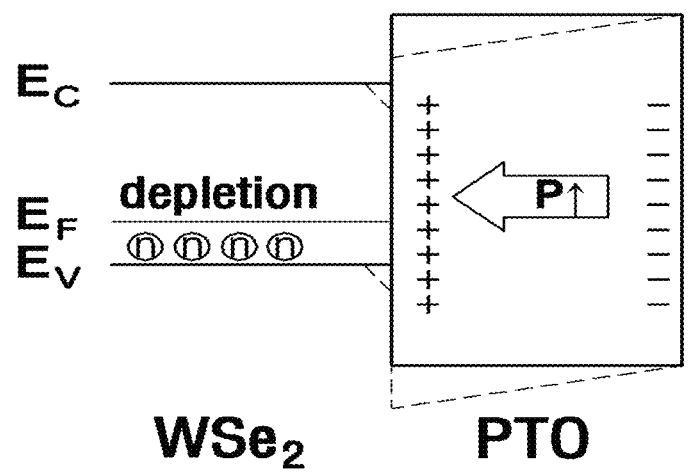
FIG. 5E shows the band alignment in the $WSe_2$ layer according to ferroelectric polarization direction.
Figure 5F:
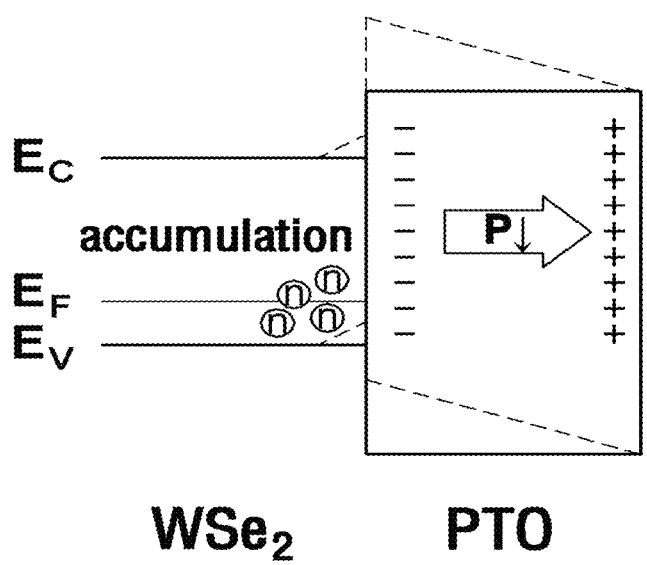
FIG. 5F shows the band alignment in the $WSe_2$ layer according to ferroelectric polarization direction, in accordance with an example of the present disclosure.

To confirm the polarization effect, the present inventors need to study the dependence on polarization state. To this end, the present inventors obtained the transport properties after the poling process. The present inventors could control the direction of the polarization by using the poling process, which means that the polarity of the bound charges can be controlled at the interface. FIG. 5 shows the polarization effect on the transport properties. The bound charges in the ferroelectric polarization induce changes of the rectifying characteristics and cause switching of the diode direction. FIG. 5A shows switching properties of a $MoS_2$ layer depending on poling process after positive poling (▲), with no poling (●), and after negative poling (▼), FIG. 5B shows the band alignment in the $MoS_2$ layer according to ferroelectric polarization direction, FIG. 5C shows the band alignment in the $MoS_2$ layer according to ferroelectric polarization direction, and FIG. 5D shows switching properties of a $WSe_2$ layer depending on poling process after positive poling (▲), with no poling (●), and after negative poling (▼), FIG. 5E shows the band alignment in the $WSe_2$ layer according to ferroelectric polarization direction, and FIG. 5F shows the band alignment in the $WSe_2$ layer according to ferroelectric polarization direction. The movement of free charges in the 2D semiconducting materials are greatly affected by the ferroelectric polarization direction, and, thus the band alignment states are changed.

The changes of the current was obtained during the poling process as shown in FIG. 5. The polarization effect on the transport properties were very apparent in the $MoS_2$/PTO heterostructure as shown in FIG. 5A. When an upward polarization state (P↑) was induced by applying the positive poling process as shown in FIG. 5B, positive bound charges were located at the interface and the polarization state was maintained after the poling. Therefore, the accumulation of electrons in the $MoS_2$ layers was improved in comparison with the initial state before the poling process showing highly increased rectifying characteristics. When a downward polarization state (P↓) was induced by applying the negative poling process as shown in FIG. 5C, negative bound charges were located at the interface and minor carriers (i.e., holes) of the $MoS_2$ layer were strongly attracted to the bound charges, which was a change from the initial state. As shown in FIG. 5D, the polarization effect in the $WSe_2$/PTO heterostructure was also examined. The $WSe_2$ layer have carriers of opposite polarity to those in the $MoS_2$ layer, and, thus, as shown in FIG. 5E and FIG. 5F, the holes are pushed out in the upward polarization state and accumulated in the downward polarization state. After the poling process, the current increased remarkably in the negative bias region. However, it is more difficult to determine the dependence of the poling process on polarization in the $WSe_2$ layer than in the $MoS_2$ layer. However, it was found that the changes in the electrical characteristics through the poling process can support the polarization-dependent interfacial coupling effect. Further, the potential profiles were found to be changed as a function of direction of the polarization state to induce the improved transport properties as shown in FIG. 5B, FIG. 5C, FIG. 5E, and FIG. 5F. Therefore, the ferroelectric polarization can regulate the transport properties by controlling the interactions between the bound charges and the free charges. This result provides a strong evidence for the existence of the polarization-dependent interfacial coupling effect.

Figure 6A:
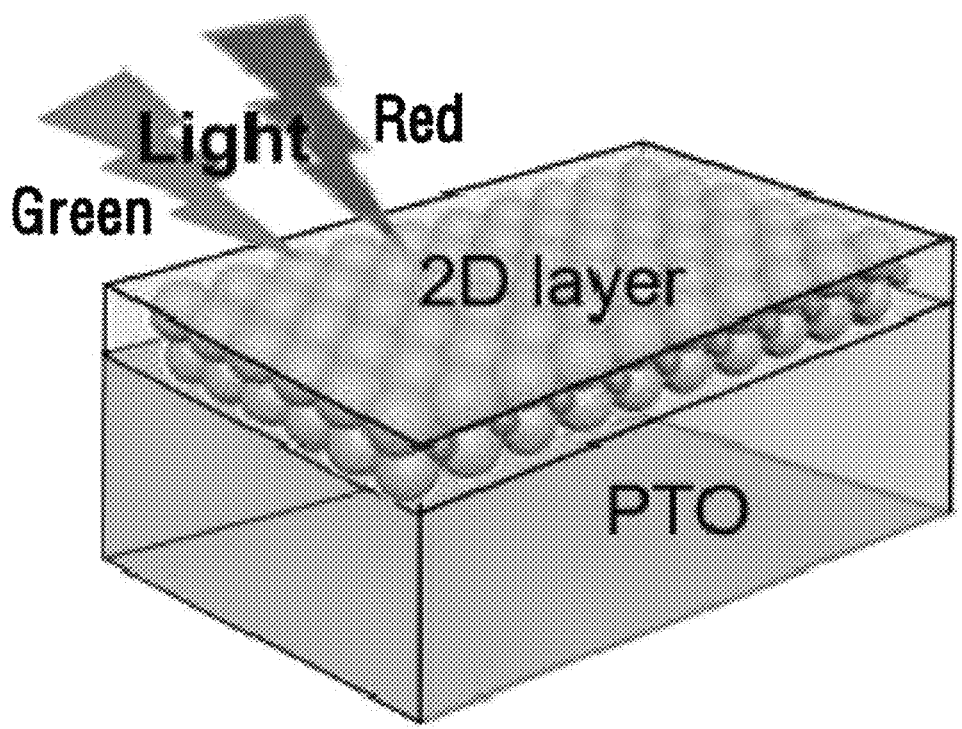
FIG. 6A shows a schematic diagram of current-voltage (I-V) characteristics upon laser beam irradiation ($\lambda$=532 nm: Green or 640 nm: Red).
Figure 6B:
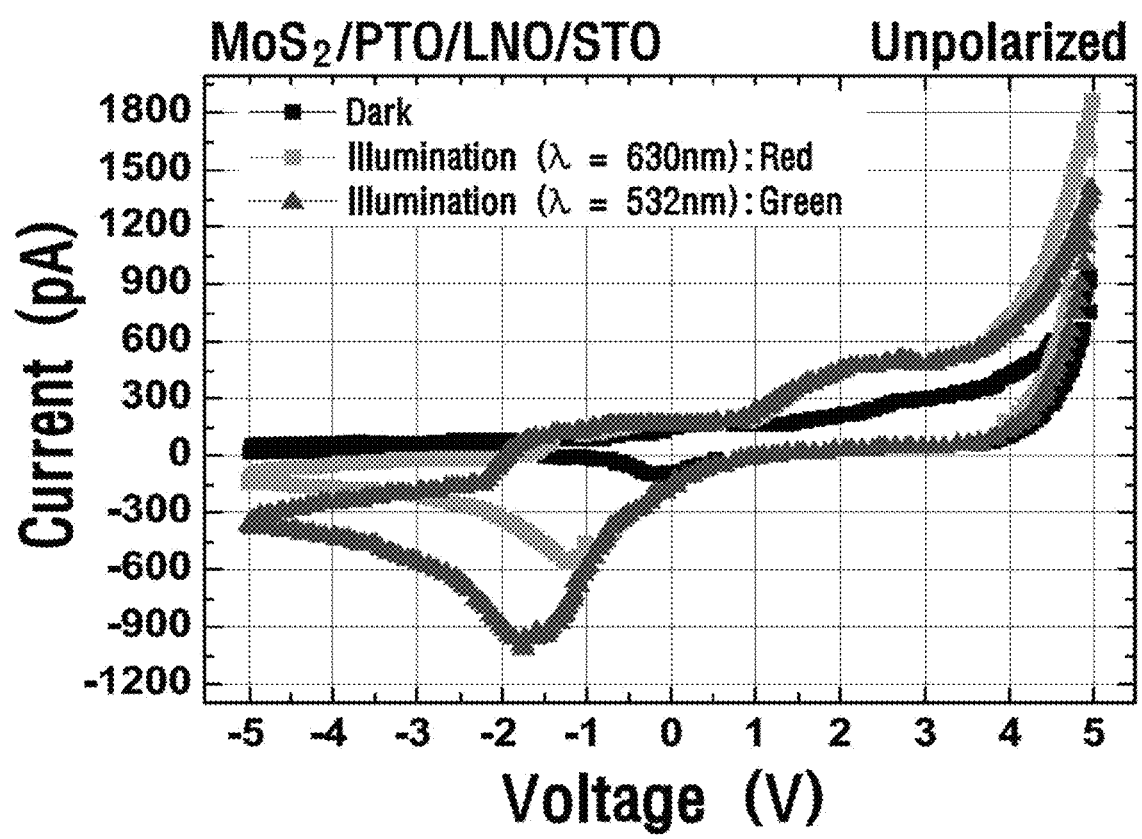
FIG. 6B shows I-V characteristics of a $MoS_2$ layer under dark condition (Dark) and under light irradiation using the two types of lasers (Green and Red).
Figure 6C:
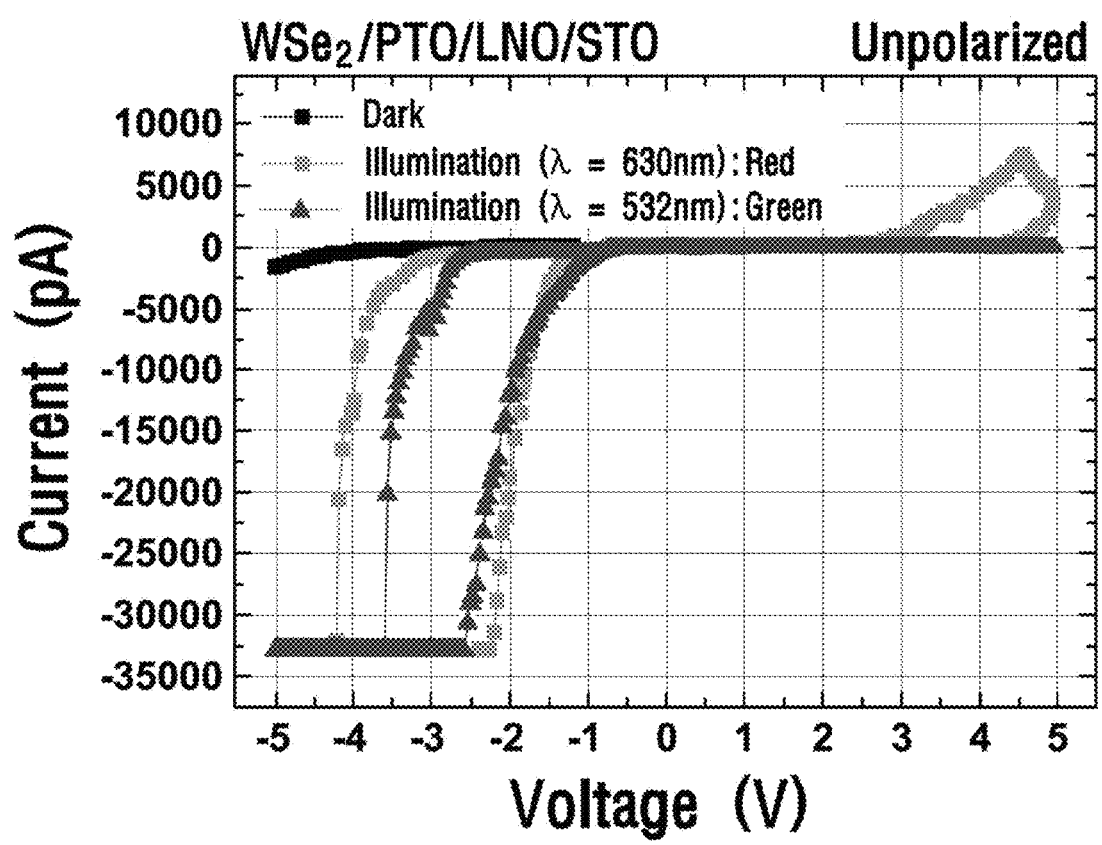
FIG. 6C shows I-V characteristics of a $WSe_2$ layer under dark condition (Dark) and under light irradiation using the two types of lasers (Green and Red), in accordance with an example of the present disclosure.

In addition to the polarization effect on the transport properties, light irradiation is an excitation source for the semiconducting layer and thus can cause a change in the transport properties. FIG. 6 shows the photocurrents observed under laser irradiation. FIG. 6A shows a schematic diagram of current-voltage (I-V) characteristics upon laser beam irradiation (λ=532 nm: Green or 640 nm: Red), and FIG. 6B shows I-V characteristics of a $MoS_2$ layer under dark condition (Dark) and under light irradiation using the two types of lasers (Green and Red), and FIG. 6C shows I-V characteristics of a $WSe_2$ layer under dark condition (Dark) and under light irradiation using the two types of lasers (Green and Red).

In the present example, as shown in FIG. 6A, lasers having wavelengths of 532 nm (Green) and 640 nm (Red) were used for light irradiation. Under light irradiation, the current increased as shown in FIG. 6B and FIG. 6C. In the $MoS_2$/PTO heterostructure, the tendency of current flow was maintained well and as shown in FIG. 6B, the current increased in the negative bias region and the positive bias region, and more light-excited carriers were generated with using the laser having a shorter wavelength. In the $WSe_2$/PTO heterostructure under light irradiation, the current increased remarkably in the negative bias region, and as shown in FIG. 6C, the current was further increased with using the 640-nm laser. Although a stable photoresponse was obtained from the negative bias region in the $WSe_2$/PTO heterostructure, it was difficult for the present inventors to understand the dependence of a current on a light-irradiation wavelength. Therefore, the present inventors have determined that the $MoS_2$/PTO heterostructure is more suitable to understand the transport mechanism under light irradiation.

Figure 7A:
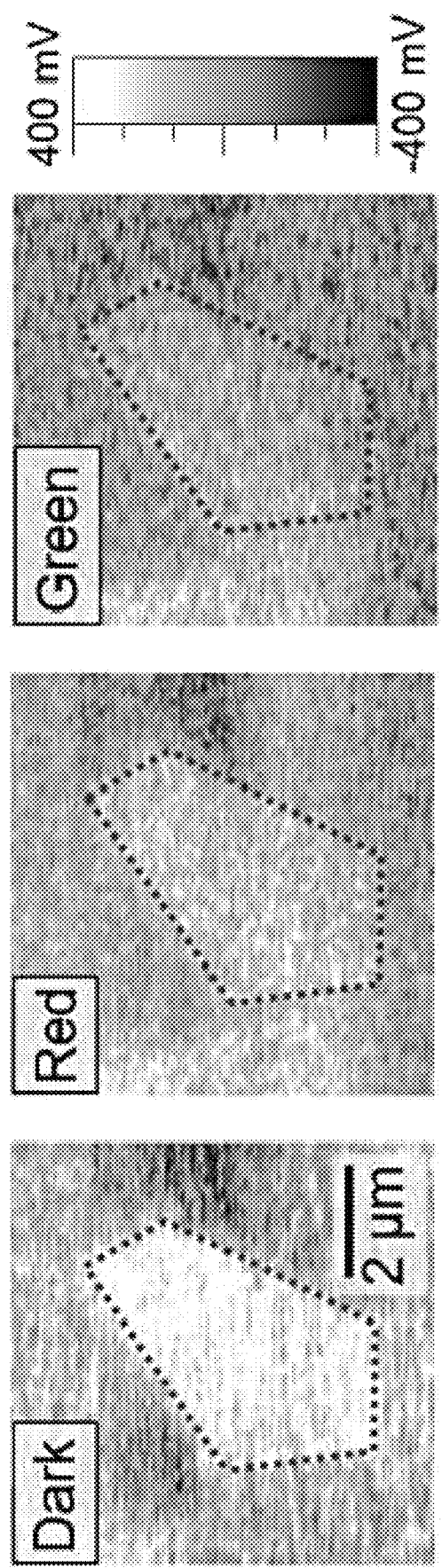
FIG. 7A shows surface potential maps under dark condition (Dark) and under light irradiation using two types of lasers ($\lambda$=532 nm: Green or 640 nm: Red).
Figure 7B:
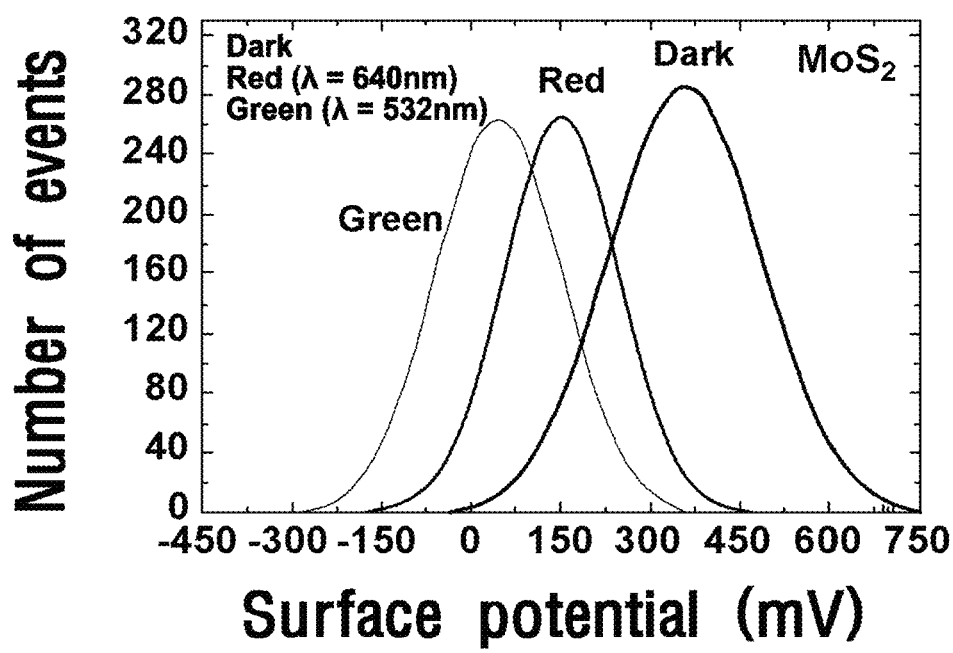
FIG. 7B shows histograms of surface potential of $MoS_2$.
Figure 7C:
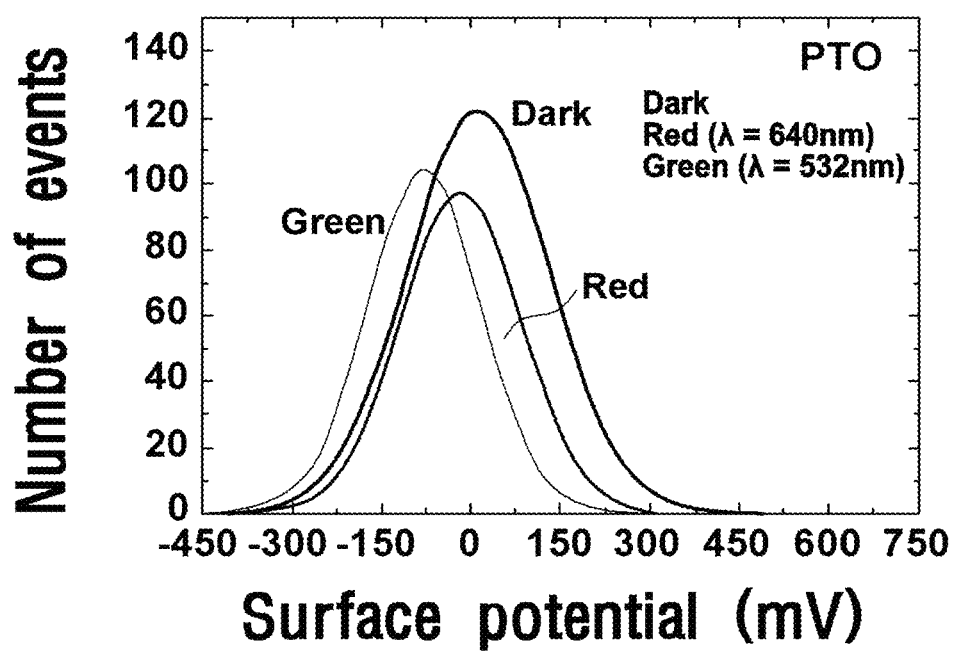
FIG. 7C shows histograms of surface potential PTO, in accordance with an example of the present disclosure.

FIG. 7 shows KPFM measurements under laser irradiation. FIG. 7A shows surface potential maps under dark condition (Dark) and under light irradiation using two types of lasers ($\lambda$=532 nm: Green or 640 nm: Red), and FIG. 7B shows histograms of surface potential of $MoS_2$ and FIG. 7C shows histograms of surface potential PTO. The surface potential change is greater on the $MoS_2$ layer than that on the PTO region.

To determine the relationship between the light irradiation effect and the change in the transport properties, surface photovoltages were measured from the $MoS_2$/PTO heterostructure by the KPFM as shown in FIG. 7. FIG. 7A shows surface potential maps under light irradiation. It can be seen that the surface potential of the $MoS_2$ layer decreases by light irradiation, which means the shift of Fermi level in the heterostructure. FIG. 7B presents histograms of surface potential for respective regions. Herein, a remarkable change in the surface potential was observed only from the $MoS_2$ layer. Further, as shown in FIG. 7A, when the laser wavelength for light irradiation decreased, the surface potential decreased. The change of surface potential indicates the re-distribution of carriers under the light irradiation in the $MoS_2$ layer.

Figure 8A:
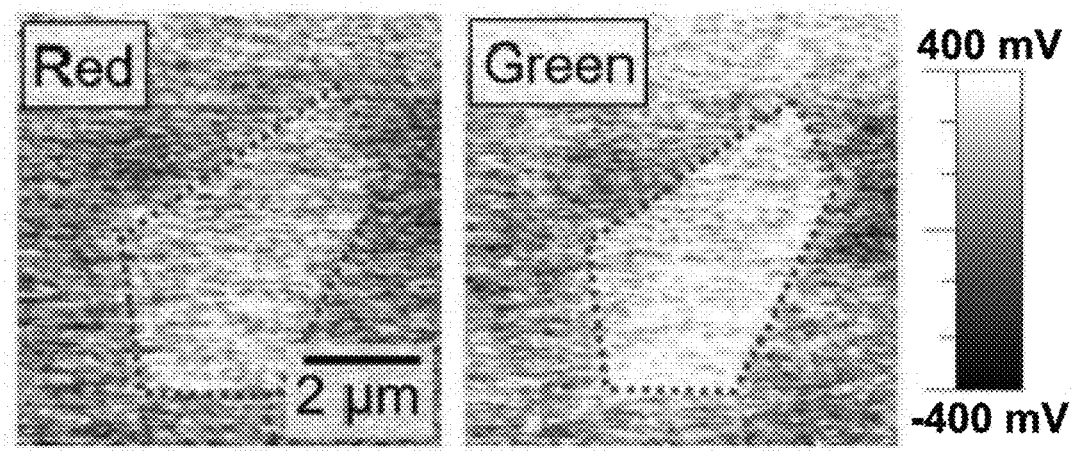
FIG. 8A shows surface photovoltage maps using laser beam irradiation ($\lambda$=532 nm: Green or 640 nm: Red).
Figure 8B:
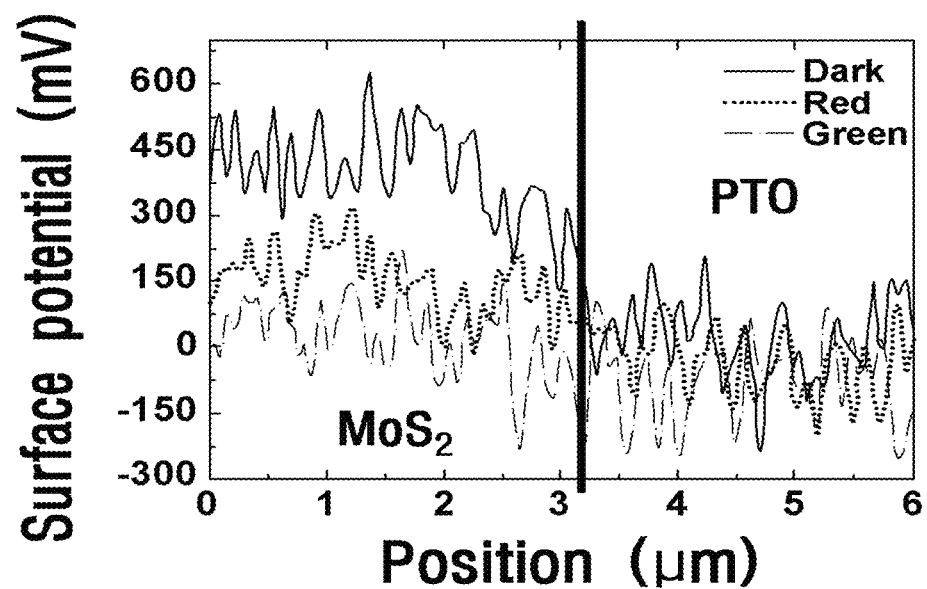
FIG. 8B shows surface potential line profiles in $MoS_2$ and PTO regions, in accordance with an example of the present disclosure.

Surface photovoltage maps can be derived from the surface potential maps by calculating a difference in the surface potential before and after the light irradiation. FIG. 8 shows the observed photovoltages and the potential distribution. FIG. 8A shows surface photovoltage maps using laser beam irradiation ($\lambda$=532 nm: Green or 640 nm: Red), and FIG. 8B shows surface potential line profiles in $MoS_2$ and PTO regions. Upon light irradiation, the vacuum levels became realigned and the shift in the Fermi level induces a built-in potential at the interface, which generates an interface photovoltage. As the laser energy is increased, the interface photovoltage is also increased. As shown in the surface photovoltage maps in FIG. 8A, a higher interface photovoltage was obtained when light irradiation was conducted using the laser having a shorter wavelength. As shown in FIG. 8B, a difference in potential between the $MoS_2$ and PTO regions may aid charge separation in the heterostructure which helps the increase of photoresponse.

Figure 9A:
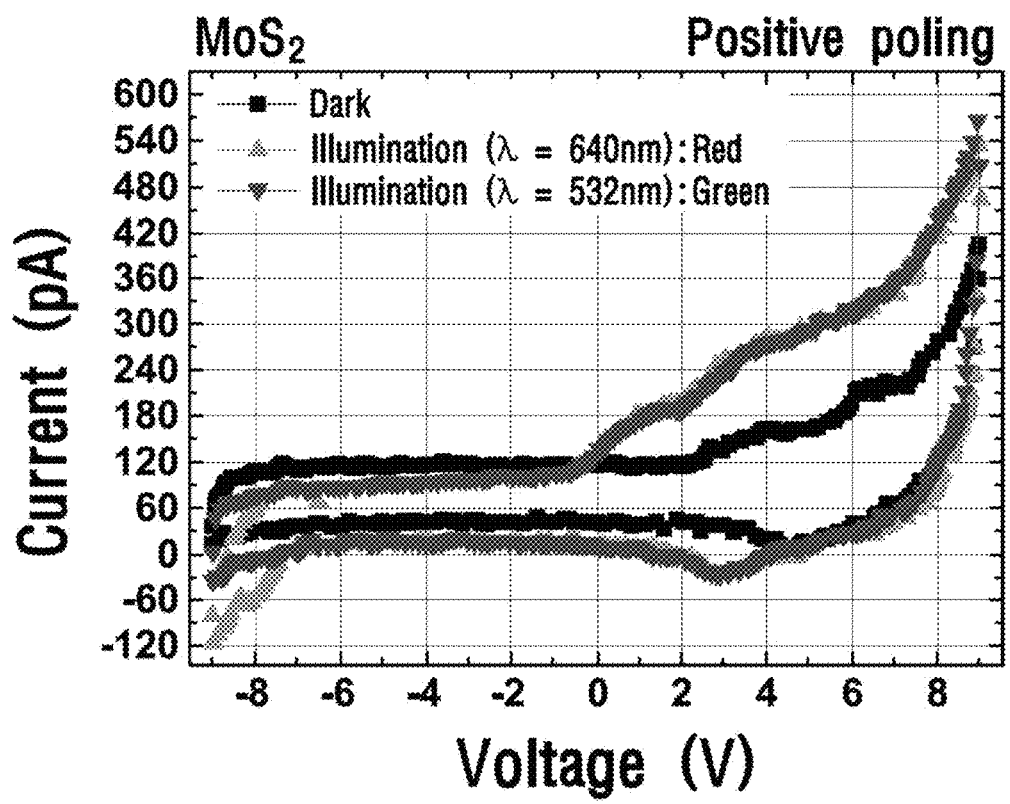
FIG. 9A shows positive poling of the heterostructure formed of $MoS_2$/PTO, under dark condition (Dark) and under laser beam irradiation ($\lambda$=532 nm: Green or 640 nm: Red).
Figure 9B:
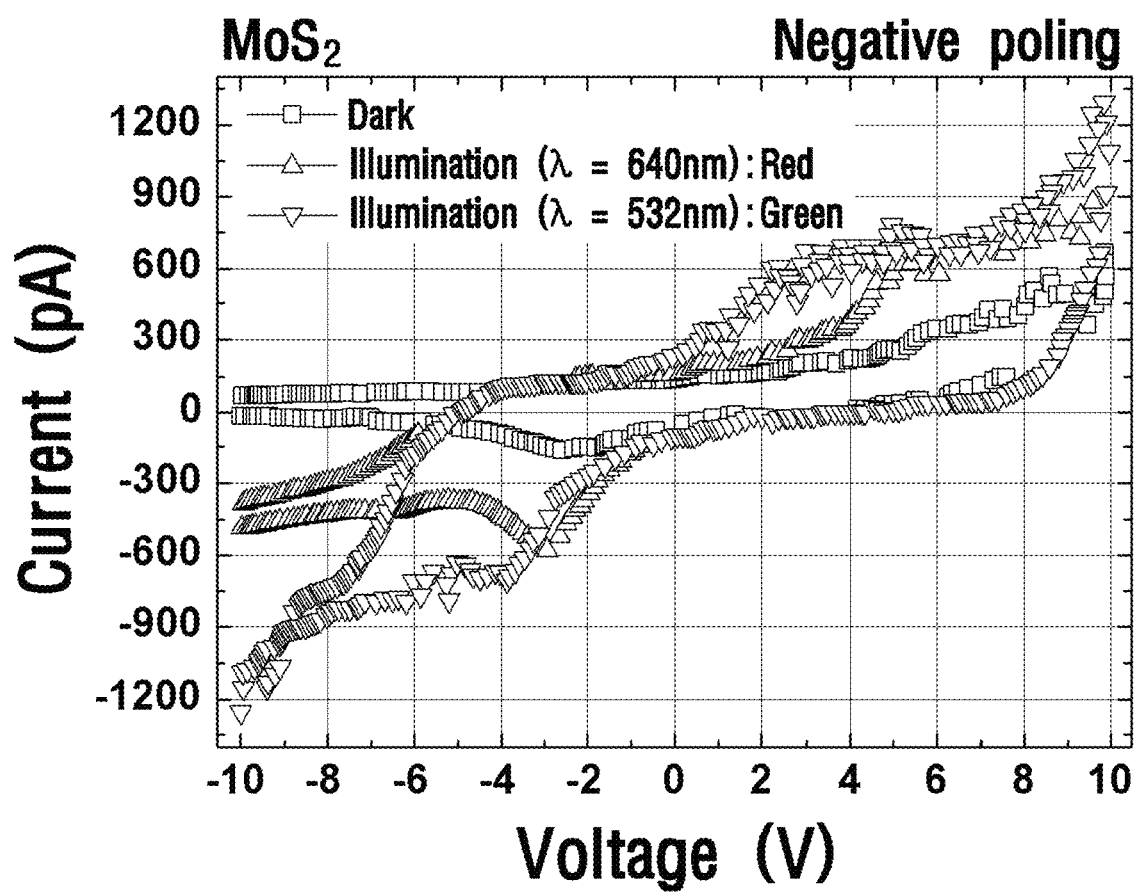
FIG. 9B shows current-voltage (I-V) characteristics after negative poling of the heterostructure formed of $MoS_2$/PTO.
Figure 9C:
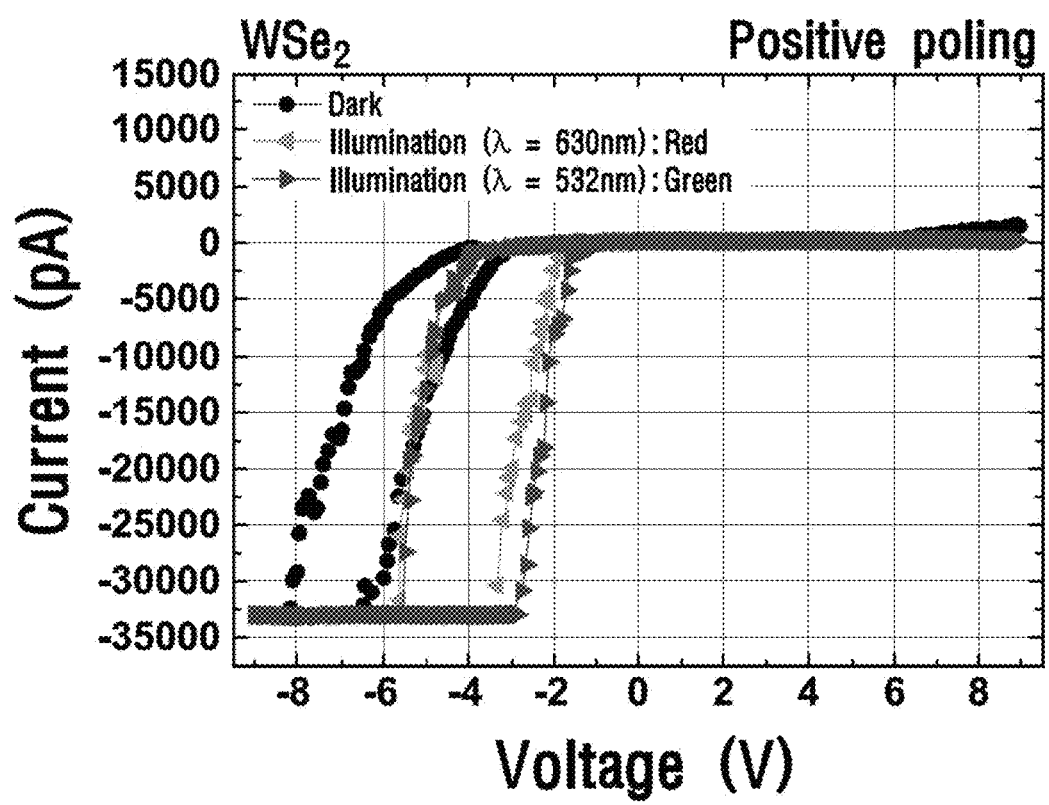
FIG. 9C shows positive poling of the heterostructure formed of $WSe_2$/PTO under dark condition (Dark) and under laser beam irradiation ($\lambda$=532 nm: Green or 640 nm: Red).
Figure 9D:
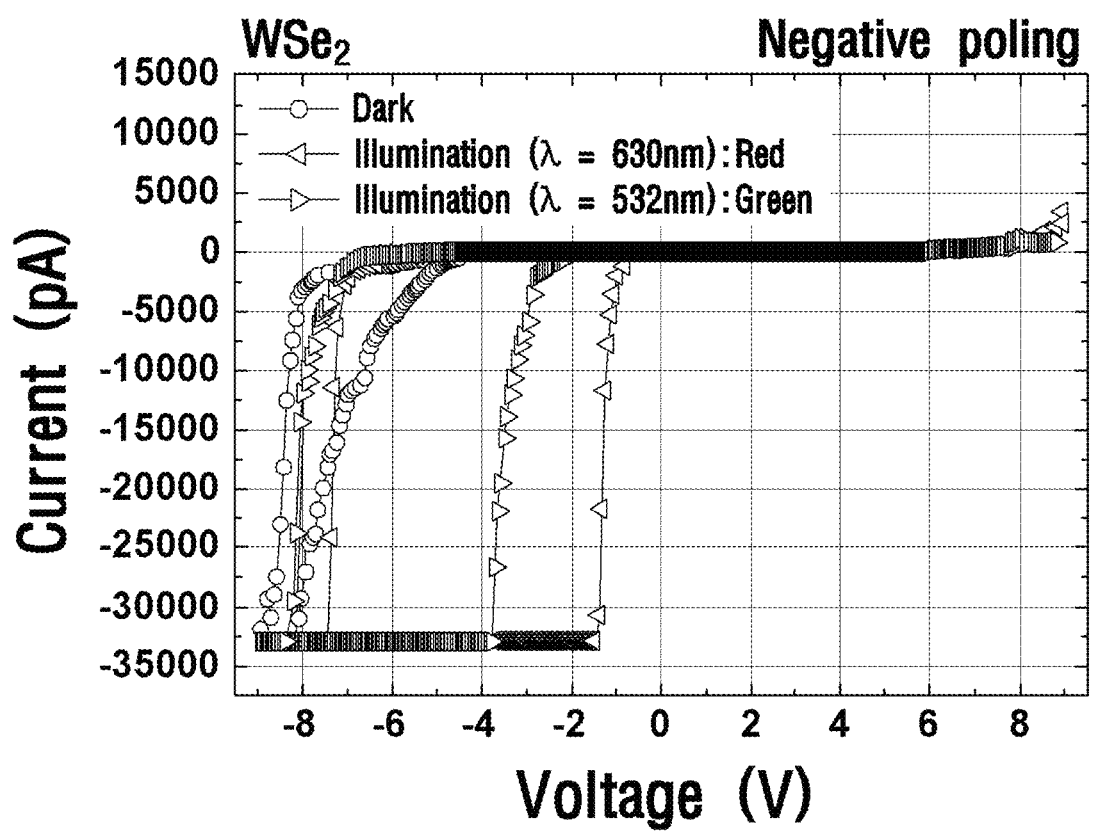
FIG. 9D shows current-voltage (I-V) characteristics after negative poling of the heterostructure formed of $WSe_2$/PTO under dark condition (Dark) and under laser beam irradiation ($\lambda$=532 nm: Green or 640 nm: Red), in accordance with an example of the present disclosure.

By coupling the ferroelectric and the semiconducting properties, the photovoltaic effect can be enhanced due to the polarization-dependent interfacial coupling effect. To obtain this enhancement in the photovoltaic behavior, the ferroelectric polarization can be used as an external electric field. Upon application of the poling process at the interface, the bound charges strongly capture the free charges, which creates a strongly aligned polarization distribution. Due to the distribution of the bound charges, separation of electron-hole pairs in the semiconducting atomic sheets can be obtained. FIG. 9 shows the polarization as a physically-doped electrode for photovoltaic response. After the polarization direction in the ferroelectric material was aligned by poling, a response to light was observed. As a result, FIG. 9A and FIG. 9B show that a change is made depending on the direction of the ferroelectric polarization and the open voltage and the short circuit current are enhanced. FIG. 9A shows positive poling of the heterostructure formed of $MoS_2$/PTO, under dark condition (Dark) and under laser beam irradiation ($\lambda$=532 nm: Green or 640 nm: Red), and FIG. 9B shows current-voltage (I-V) characteristics after negative poling of the heterostructure formed of $MoS_2$/PTO, FIG. 9C shows positive poling of the heterostructure formed of $WSe_2$/PTO under dark condition (Dark) and under laser beam irradiation ($\lambda$=532 nm: Green or 640 nm: Red), FIG. 9D shows current-voltage (I-V) characteristics after negative poling of the heterostructure formed of $WSe_2$/PTO under dark condition (Dark) and under laser beam irradiation ($\lambda$=532 nm: Green or 640 nm: Red). The I-V characteristics after the poling process show that the ferroelectric polarization acts as an external electric field for efficient charge separation of photo-generated carriers. As shown in FIG. 9, the I-V characteristics were obtained after the poling process under light irradiation. In the $MoS_2$/PTO heterostructure, the short circuit current in the positive (negative) bias region was enhanced after the positive (negative) poling process as shown in FIG. 9A and FIG. 9B. Further, during the positive poling process or the negative poling process, the current increased in the positive bias region and the negative bias region as shown in FIG. 9A and FIG. 9B, respectively. Similarly, in the $WSe_2$/PTO heterostructure, the current increased and the memory window increased remarkably as shown in FIG. 9C and FIG. 9D. Particularly, the memory window increased more remarkably after the negative poling process, which may be due top-type characteristics of $WSe_2$. Most of the carriers in the p-type $WSe_2$ layers are holes, and, thus the current flow becomes more profound in the negative bias region and the negative poling aids the accumulation of holes at the interface.

Figure 10:
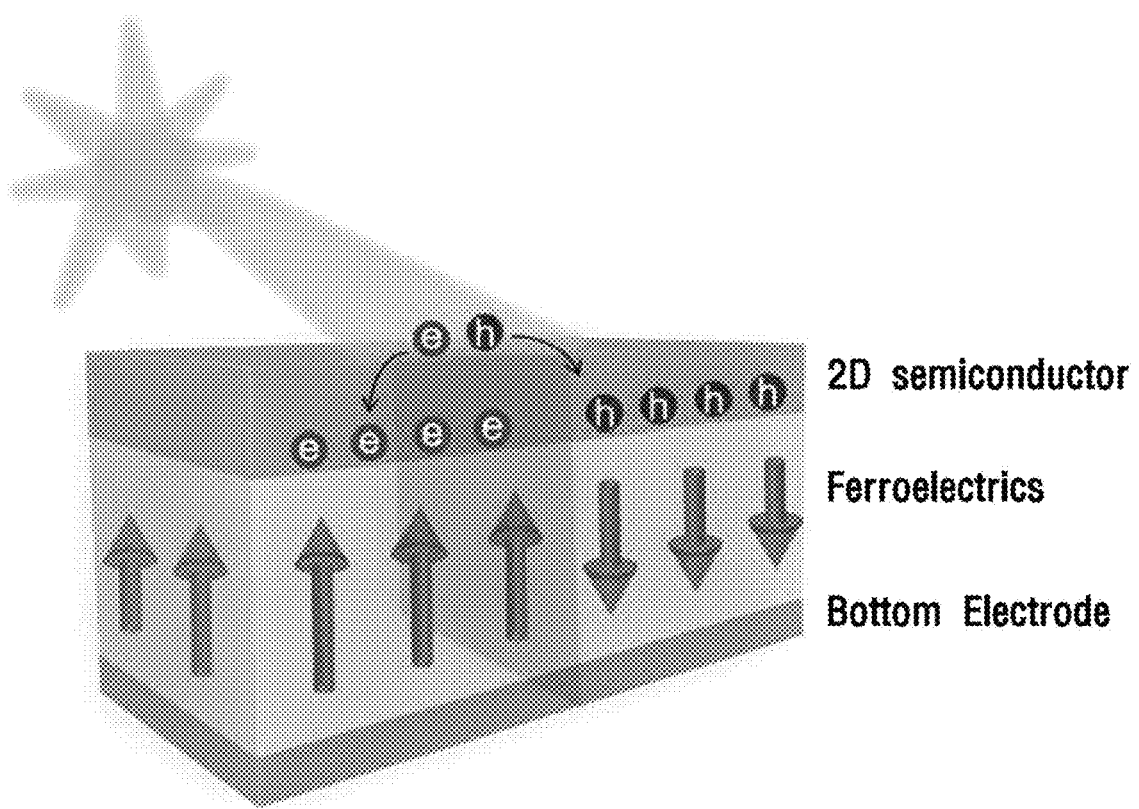
FIG. 10 is a schematic diagram illustrating a solar cell device including a ferroelectric material and a 2D semiconducting layer in accordance with an embodiment of the present disclosure.

FIG. 10 is a schematic diagram illustrating a solar cell device, as a possible photovoltaic device structure, including a ferroelectric material layer and a 2D semiconducting layer in accordance with embodiments of the present disclosure. Upon light irradiation, the positive (negative) bound charges attract electron (hole) carriers from the 2D semiconducting layer.

As a result, the photo-generated carriers are effectively separated by the ferroelectric polarization, which means that non-PN junction solar cells can be achieved as shown in FIG. 10. In this respect, a memory device using the photovoltaic effect can be suggested as a novel functional device by coupling functional atomic sheets with a ferroelectric thin film. Further, the present inventors can select other 2D materials and ferroelectric materials and obtain similar characteristics upon considering each of the various materials.

In the present disclosure, the present inventors investigated the enhancement in the resistive switching effect by integrating the ferroelectric $PbTiO_3$ thin film with 2D semiconducting atomic sheets of n-type $MoS_2$ and p-type $WSe_2$. The present inventors also investigated to obtain the polarization-dependent interfacial coupling effect by using 2D semiconductors. Particularly, the present inventors obtained the photovoltaic properties by controlling the ferroelectric polarization state. The present disclosure is provided to prove that the ferroelectric material coupled with the semiconducting atomic sheets can be useful for novel photovoltaic devices.

In sum, interactions between free charges and bound charges in two-dimensional (2D) van der Waals materials on ferroelectric oxides describe novel combinations of three monopoles that induce unique photovoltaic properties of a system. In the present disclosure, the interface transport properties were controlled by vertically integrating the 2D semiconducting materials (n-type $MoS_2$ and p-type $WSe_2$) with the ferroelectric ($PbTiO_3$) oxides. It was found that the ferroelectric polarization as a permanent dipole induces accumulation or depletion in semiconducting layered materials, and the polarization-dependent interfacial coupling effect was achieved. Accordingly, the enhanced resistive switching effect was obtained from the heterostructure. In the present disclosure, it was proved that the polarization at the interface can promote efficient charge separation of photo-generated carriers in the 2D layers due to a controllable built-in interfacial electric field. The $MoS_2$ layers suggest a photo-memristor with the resistive switching and photovoltaic effects based on the above-described results, which suggests a new platform of semiconducting-ferroelectric system for memory and photovoltaic devices.

In the present disclosure, the free charge-bound charge interactions between the semiconducting atomic sheets and the ferroelectric thin films were examined. The RS effect was obtained from a vertical heterostructure in which the semiconducting atomic sheets were used on the ferroelectric PTO thin films. The polarization-dependent interfacial coupling was examined from the heterostructure, and it was shown that the ferroelectric polarization can include accumulation or depletion in the semiconducting layers. In addition to the ferroelectric polarization effect, the photovoltaic effect was also obtained from the heterostructure. By coupling the ferroelectric material and the semiconducting properties, the photovoltaic effect was enhanced. The built-in field between the two materials can induce an interface photovoltage in the heterostructure. Therefore, the ferroelectric material and semiconducting atomic sheets can be used to manufacture novel photovoltaic devices that use the interactions between free charges of carriers in the semiconducting sheets and bound charges in the ferroelectric polarization.

Further, a ferroelectric-semiconducting heterojunction is used in a photovoltaic system. In such photovoltaic devices, the ferroelectric polarization is an external field in a heterojunction that aids physical separation of photo-generated carriers in semiconductors that cause stable separation of electron-hole pairs. The ferroelectric polarization can be also used in a photoelectrochemical process and piezocatalysis. The charge distribution can be optically controlled by introducing optical switching properties of the ferroelectric materials upon ultraviolet radiation. The control of the resistive switching effect can be optically obtained by optically controlling a conduction state, and a photosensitive memristor or an optoelectronic resistive switching memory can be obtained.

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

The invention claimed is:
1. A resistive switching element, comprising:
a bottom electrode formed on a substrate;
an oriented ferroelectric material layer formed on the bottom electrode;
a two dimensional semiconducting material layer formed on the ferroelectric material layer; and
a top electrode formed on the two dimensional semiconducting material layer,
wherein polarization of the ferroelectric material layer and electron-hole separation phenomenon of the two dimensional semiconducting material layer are combined to induce resistive switching phenomenon,
wherein the ferroelectric material layer and the two dimensional semiconducting material layer are in direct contact,
wherein the ferroelectric material layer has a crystal form of a hexagonal structure grown in (111) or (001) direction,
wherein the ferroelectric material layer is poled upward or downward, and
wherein the substrate is a (111)-oriented monocrystalline substrate or a (001)-oriented monocrystalline substrate.
2. The resistive switching element according to claim 1, wherein the ferroelectric material includes $PbTiO_3$, $BaTiO_3$, $BiFeO_3$, $PbZr_xTi_{1-x}O_3$ (PZT), or $LiNbO_3$.
3. The resistive switching element according to claim 1, wherein the two dimensional semiconducting material includes $MoS_2$, $MoSe_2$, $WSe_2$, $ReS_2$, $ReSe_2$, $MoTe_2$, $WS_2$, or $WTe_2$.
4. The resistive switching element according to claim 1, wherein the bottom electrode includes a metal or a conductive oxide, and is a transparent or opaque electrode.
5. A photovoltaic device, comprising:
a resistive switching element according to claim 1, wherein:
the substrate is transparent, and
the bottom electrode is transparent.
6. The photovoltaic device according to claim 5, wherein electron-hole separation formed in the two dimensional semiconducting material layer increases by polarization of the ferroelectric material layer upon light irradiation.

* * * * *